(12) United States Patent
Sakamoto et al.

(10) Patent No.: US 10,396,080 B2
(45) Date of Patent: Aug. 27, 2019

(54) SEMICONDUCTOR DEVICE AND METHOD OF MANUFACTURING THE SAME

(71) Applicant: RENESAS ELECTRONICS CORPORATION, Tokyo (JP)

(72) Inventors: Kazuo Sakamoto, Tokyo (JP); Toshiaki Ito, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 15/985,280

(22) Filed: May 21, 2018

(65) Prior Publication Data

US 2019/0006364 A1    Jan. 3, 2019

(30) Foreign Application Priority Data

Jun. 28, 2017   (JP) .................................. 2017-125983

(51) Int. Cl.
*H01L 27/092*    (2006.01)
*H01L 21/8238*   (2006.01)
*H01L 27/02*     (2006.01)

(52) U.S. Cl.
CPC .. *H01L 27/0928* (2013.01); *H01L 21/823807* (2013.01); *H01L 21/823892* (2013.01); *H01L 27/0259* (2013.01)

(58) Field of Classification Search
CPC ......... H01L 27/0928; H01L 21/823892; H01L 21/823807
USPC ................. 257/371, 300, 206, 288
See application file for complete search history.

(56) References Cited

U.S. PATENT DOCUMENTS

| | | | |
|---|---|---|---|
| 7,821,076 B2 | 10/2010 | Morino et al. | |
| 2009/0179247 A1 | 7/2009 | Fujii et al. | |
| 2010/0025761 A1* | 2/2010 | Voldman | H01L 21/82389 257/338 |
| 2010/0044755 A1* | 2/2010 | Tsuda | H01L 27/0207 257/206 |
| 2012/0161857 A1* | 6/2012 | Sakaguchi | H02M 3/07 327/536 |
| 2013/0208385 A1* | 8/2013 | Salcedo | H01L 23/60 361/111 |
| 2013/0320498 A1* | 12/2013 | Salcedo | H01L 29/747 257/565 |
| 2014/0177312 A1* | 6/2014 | Shibata | H01L 27/0207 365/72 |

(Continued)

FOREIGN PATENT DOCUMENTS

JP    2009-194369 A    8/2009
JP    2009-272552 A    11/2009

*Primary Examiner* — Bo Fan
(74) *Attorney, Agent, or Firm* — McDermott Will & Emery LLP

(57) ABSTRACT

According to one embodiment, a semiconductor device includes a shallow P-well, a shallow N-well, a shallow P-well, and a shallow N-well formed in regions different from one another, a deep N-well formed in a part deeper than the shallow P-well and the shallow N-well, and a base material, and further includes a first transistor formed in a part of the shallow P-well and the shallow N-well on the side of the principal surface, and a second transistor formed in a part of the shallow P-well and the shallow N-well on the side of the principal surface, in which the shallow N-well is formed in such a way as to surround the peripheral edge of the region of the shallow P-well.

19 Claims, 20 Drawing Sheets

(56) References Cited

U.S. PATENT DOCUMENTS

2014/0191328 A1* 7/2014 Tsuruta ............... H01L 27/0207
              257/371
2015/0137236 A1* 5/2015 Liu ..................... H01L 27/1211
              257/347

* cited by examiner

| ANALYSIS CHIP | DN-WELL AREA [μm²] | P-WELL AREA [μm²] | $R_{PWG}$ SMALL 1kΩ | $R_{PWG}$ LARGE 1MΩ | $R_{PWG}$ ∞ 300MΩ |
|---|---|---|---|---|---|
| A | $7.5 \times 10^7$ | $2.6 \times 10^7$ | OK | NG | NG |
| B | $7.2 \times 10^7$ | $2.5 \times 10^5$ | OK | OK | NG |
| C | $3.5 \times 10^7$ | $8.8 \times 10^3$ | OK | OK | OK |

SEMICONDUCTOR DEVICE AND METHOD OF MANUFACTURING THE SAME

CROSS-REFERENCE TO RELATED APPLICATIONS

This application is based upon and claims the benefit of priority from Japanese patent application No. 2017-125983, filed on Jun. 28, 2017, the disclosure of which is incorporated herein in its entirety by reference.

BACKGROUND

The present disclosure relates to a semiconductor device and a method of manufacturing the same, and relates to, for example, a semiconductor device including a deep well and a method of manufacturing the same.

Japanese Unexamined Patent Application Publication Nos. 2009-272552 and 2009-194369 each disclose a semiconductor device including an N-type deep well (this well is referred to as a deep N-well) formed in a P-type semiconductor substrate. The semiconductor device disclosed in Japanese Unexamined Patent Application Publication No. 2009-272552 moves electric charges accumulated in the deep N-well in a manufacturing process to the semiconductor substrate using a diffusion tap.

Specifically, a P-type shallow well (this well is referred to as a shallow P-well) and an N-type shallow well (this well is referred to as a shallow N-well) are formed on the deep N-well. Further, a shallow P-well and a shallow N-well are formed in a region on the semiconductor substrate other than the region in which the deep N-well is formed. A P-type diffusion tap is formed in the shallow P-well on the side of the semiconductor substrate. The P-type diffusion tap is also formed in the shallow P-well on the side of the deep N-well. Then the diffusion taps are connected to each other.

Next, an N-type MOS transistor (this transistor is referred to as an NMOS) is formed in the shallow P-well on the side of the deep N-well, and a P-type MOS transistor (this transistor is referred to as a PMOS) is formed in the shallow N-well. An NMOS is formed in the shallow P-well on the side of the semiconductor substrate, and a PMOS is formed in the shallow N-well on the side of the semiconductor substrate. Then drain electrodes of the NMOS and the PMOS on the side of the deep N-well and gate electrodes of the NMOS and the PMOS on the side of the semiconductor substrate are connected to each other using a wire provided above the connection of the diffusion taps.

Accordingly, the electric charges accumulated in the deep N-well move to the side of the semiconductor substrate due to the connection of the diffusion taps before the gate electrode of the NMOS and the gate electrode of the PMOS on the side of the semiconductor substrate are connected to each other.

As described above, the semiconductor device disclosed in Japanese Unexamined Patent Application Publication No. 2009-272552 moves the electric charges accumulated in the deep N-well toward the semiconductor substrate, thereby preventing gate breakdown of the NMOS and the PMOS on the side of the semiconductor substrate.

Japanese Unexamined Patent Application Publication No. 2009-194369 discloses using an inverter circuit formed on a deep N-well as a method of moving electric charges accumulated in the deep N-well in a manufacturing process to a semiconductor substrate. The semiconductor device disclosed in Japanese Unexamined Patent Application Publication No. 2009-194369 moves the electric charges accumulated in the deep N-well to the semiconductor substrate via a channel formed in the transistor of the inverter circuit.

As described above, the semiconductor devices disclosed in Japanese Unexamined Patent Application Publication Nos. 2009-272552 and 2009-194369 move the electric charges accumulated in the deep N-well to the semiconductor substrate and suppress gate breakdown of the NMOS and the PMOS.

SUMMARY

The manufacturing yields of the semiconductor devices disclosed in Japanese Unexamined Patent Application Publication Nos. 2009-272552 and 2009-194369 are not sufficiently high.

The other problems and novel characteristics will be made apparent from the descriptions of the specification and the accompanying drawings.

According to one embodiment, a semiconductor device includes a semiconductor substrate including a principal surface, in which the semiconductor substrate includes: a first shallow well of a first conductive type, a second shallow well of a second conductive type, a third shallow well of the first conductive type, and a fourth shallow well of the second conductive type formed in a part of the semiconductor substrate on a side of a principal surface in such a way that they are in regions different from one another when the semiconductor substrate is seen from the principal surface; a deep well of the second conductive type formed in a region including the first shallow well and the second shallow well, which is a region other than the region in which the third shallow well and the fourth shallow well are formed, the deep well of the second conductive type being formed in a part deeper than the first shallow well and the second shallow well in a depth direction from the principal surface; and a base material of the first conductive type formed in a region including the third shallow well, the fourth shallow well, and the deep well, the base material of the first conductive type being formed in apart deeper than the third shallow well, the fourth shallow well, and the deep well in the depth direction from the principal surface, the semiconductor device further includes: a first transistor pair including a field effect transistor of the second conductive type in which a diffusion layer of the second conductive type is formed in a part of the first shallow well on the side of the principal surface and the field effect transistor of the first conductive type in which the diffusion layer of the first conductive type is formed in a part of the second shallow well on the side of the principal surface; a second transistor pair including the field effect transistor of the second conductive type in which the diffusion layer of the second conductive type is formed in a part of the third shallow well on the side of the principal surface and the field effect transistor of the first conductive type in which the diffusion layer of the first conductive type is formed in a part of the fourth shallow well on the side of the principal surface; and a wire between transistor pairs configured to connect the first transistor pair and the second transistor pair, and the second shallow well is formed in such a way as to surround the peripheral edge of the region of the first shallow well.

According to the embodiment, it is possible to provide a semiconductor device capable of improving a manufacturing yield and a method of manufacturing the same.

BRIEF DESCRIPTION OF THE DRAWINGS

The above and other aspects, advantages and features will be more apparent from the following description of certain embodiments taken in conjunction with the accompanying drawings, in which.

DETAILED DESCRIPTION

Figure 1:
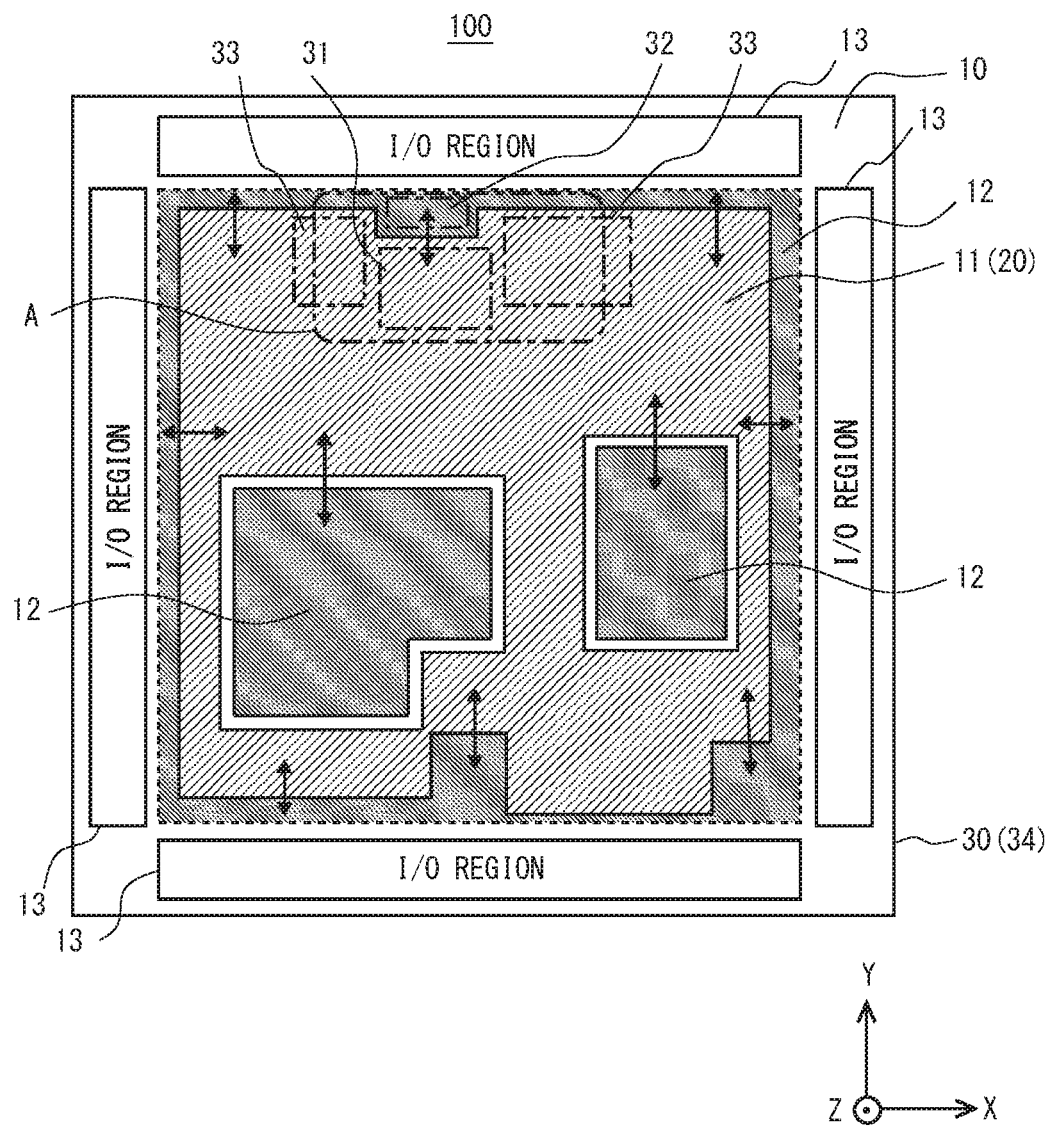
FIG. 1 is a plan view illustrating a semiconductor device.

The following description and the drawings are omitted and simplified as appropriate for the sake of clarification of the description. In the drawings, the same elements are denoted by the same reference signs, and repetitive descriptions will be avoided as necessary.

First, a cause of gate breakdown of the semiconductor device found out by the present inventors will be explained. By this explanation, semiconductor devices according to the embodiments will be made clear.

FIG. 1 is a plan view illustrating a semiconductor device. As shown in FIG. 1, a semiconductor device 100 includes a semiconductor substrate 30 including a principal surface 10. FIG. 1 is a plan view when the semiconductor device is seen from the principal surface 10. The semiconductor substrate 30 includes a part where wells, diffusion layers and the like are formed, and a base material 34, which is another part. The semiconductor device 100 includes, for example, a P-type conductive base material 34.

In the following semiconductor devices, the conductive type (P type or N type) of the substrate, the wells, the diffusion layers and the like may be inverted. When one conductive type is represented by a first conductive type and another conductive type is represented by a second conductive type, the first conductive type may be P type and the second conductive type may be N type or vice versa.

The semiconductor device 100 has, for example, a rectangular shape when it is seen from the principal surface 10. Now, for the convenience of the explanation of the semiconductor device 100, an XYZ orthogonal coordinate axis system will be introduced. The direction perpendicular to the principal surface 10 is represented by the Z-axis direction. The +Z-axis direction is also referred to as above or a side of (a side close to) the principal surface 10. The two directions perpendicular to each other in the plane parallel to the surface perpendicular to the Z-axis direction are represented by the X-axis direction and the Y-axis direction. A pair of sides that are opposed to each other in the peripheral edge of the rectangular semiconductor device 100 are extended along the X-axis direction. Another pair of sides that are opposed to each other in the peripheral edge of the semiconductor device 100 are extended along the Y-axis direction.

When the semiconductor device 100 is seen from the +Z-axis direction, that is, from the principal surface 10, the principal surface 10 includes a first region 11, a second region 12, and an I/O region 13.

The I/O region 13 is provided in the peripheral edge of the semiconductor device 100. For example, the I/O region 13 is provided along the side of the semiconductor device 100 in the +X-axis direction and the side thereof in the −X-axis direction, and the side thereof in the +Y-axis direction and the side thereof in the −Y-axis direction. The I/O region 13 is a region in which an element that receives or outputs signals from or to external devices other than the semiconductor device 100 is formed.

The first region 11 and the second region 12 are provided, for example, in a central part surrounded by the I/O region 13. The first region 11 is a region where an N-type conductive deep well (this well is referred to as a deep N-well 20 or a deep well) is formed on the semiconductor substrate 30 in the first region 11.

The second region 12 is provided in a region other than the first region 11 and the I/O region 13 when the second region 12 is seen from the principal surface 10. Accordingly, the semiconductor substrate 30 in the second region 12 does not include the deep N-well 20. The second region 12 is provided, for example, between the first region 11 and the I/O region 13. Alternatively, the second region 12 may be formed to have an island shape inside the first region 11 and may be surrounded by the first region 11.

In recent years, the functions and the processing speed of the semiconductor device 100 like an MCU or an SOC have been increasing. In order to reduce power consumption of the semiconductor device 100, a multiple power supply design is required. In order to achieve the multiple power supply design easily, it is preferable to make the first conductive type be the P type, to make the second conductive type be the N type, and to use the semiconductor substrate 30 including the P-type conductive base material 34. Therefore, the multiple power supply design is typically achieved using the semiconductor substrate 30.

The deep N-well 20 in the first region 11 is formed, for example, in a region where it is required to suppress an influence of noise from the base material 34. Further, the deep well 20 may be formed to perform control for interrupting the ground-side power supply that is aimed at reducing power consumption.

The first region 11 includes a predetermined region such as a logic region 31, a memory region 33 etc. The first region 11 may include a plurality of logic regions 31 or may include a plurality of SRAM regions or a plurality of logic regions for SRAM. The second region 12 includes a predetermined region such as a logic region 32. The second region 12 may include a plurality of logic regions 32.

The predetermined region of the first region 11 is connected to the predetermined region of the second region 12 by a wire such as a signal wire. As one example, the logic region 31 of the first region 11 is connected to the logic region 32 of the second region 12 by the signal wire. A part of the first region 11 other than the logic region and a part of the second region 12 other than the logic region may be connected to each other by the wire or the like. The first region 11 and the second region 12 may be connected to each other at a plurality of parts.

Figure 2:
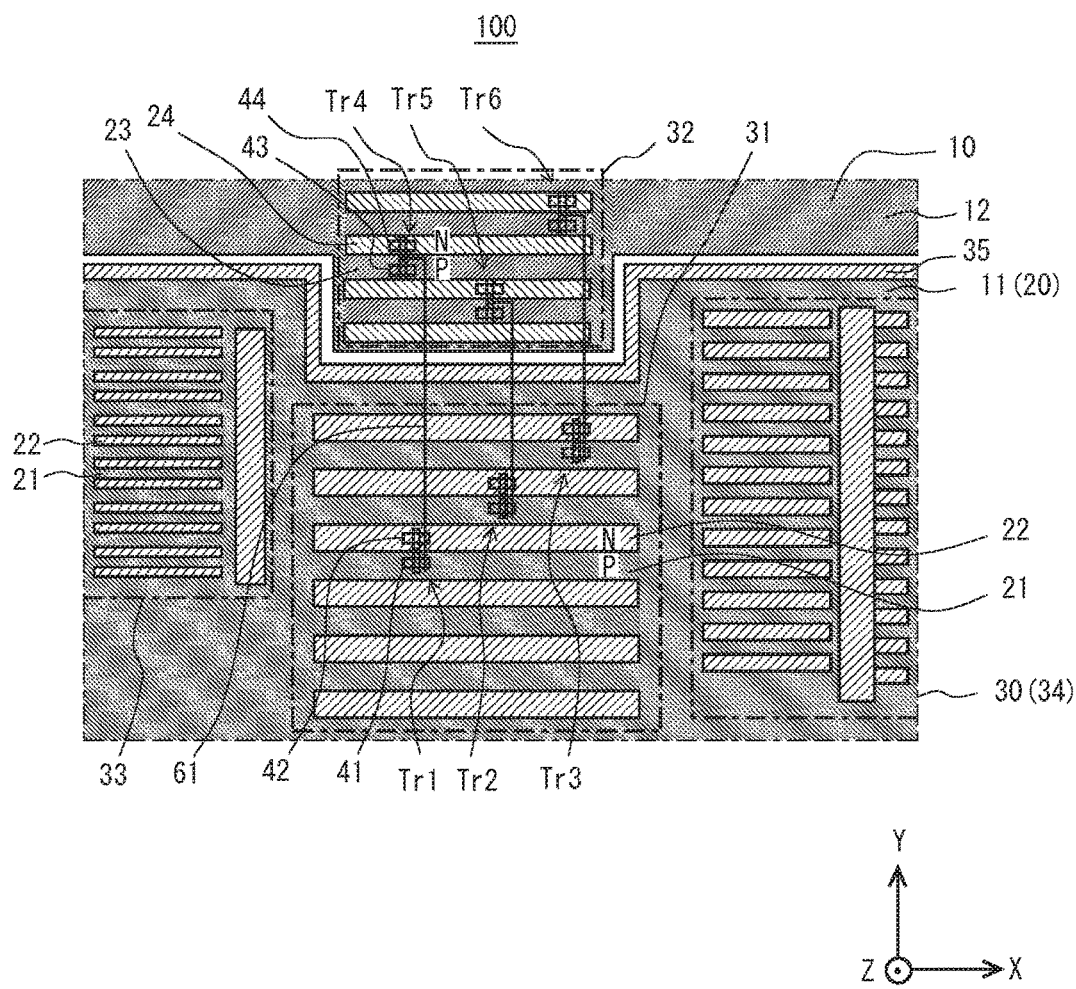
FIG. 2 is an enlarged view illustrating the semiconductor device and shows an A region of FIG. 1.

FIG. 2 is an enlarged view illustrating the semiconductor device 100, and shows an A region of FIG. 1. As shown in FIGS. 1 and 2, in the part of the semiconductor device 100 in the +Y-axis direction, the first region 11 includes a part depressed in the −Y-axis direction. The second region 12 is projected in the −Y-axis direction in the part of the first region 11 depressed in the −Y-axis direction. The logic region 32 is provided in the projected part of the second region 12. The logic region 31 is provided in the vicinity of the depressed part of the first region 11. The logic region 31 and the logic region 32 are arranged in such a way that they are aligned along the Y-axis direction.

Figure 3:
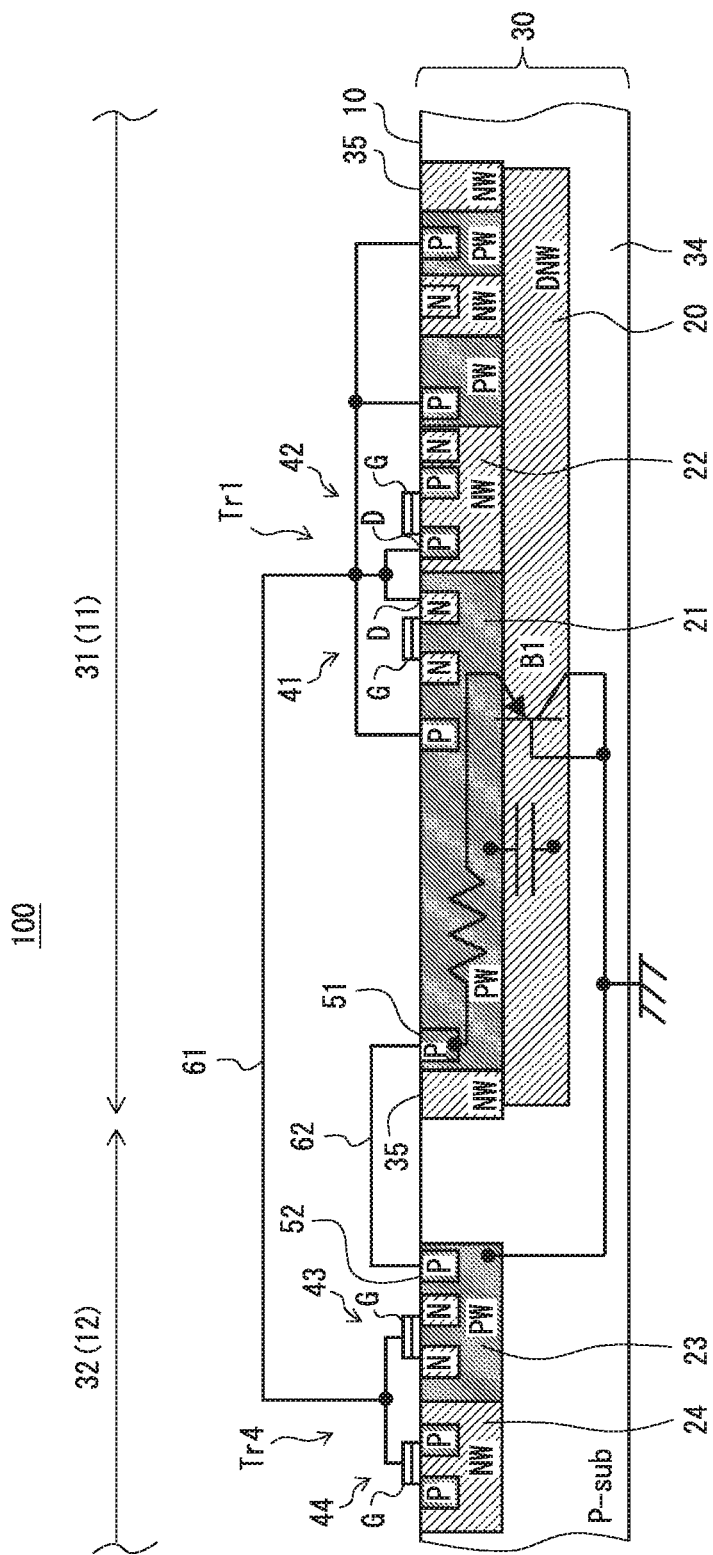
FIG. 3 is a cross-sectional view illustrating the semiconductor device.

FIG. 3 is a cross-sectional view illustrating the semiconductor device 100. The cross-sectional view shown in FIG. 3 is a schematic one, and also includes the components that are not shown in FIG. 2. As shown in FIGS. 2 and 3, the logic region 31 is formed in the first region 11. Therefore, the semiconductor substrate 30 in the logic region 31 includes the deep N-well 20. The deep N-well 20 is formed on the base material 34.

The semiconductor substrate 30 includes, besides the base material 34 and the deep N-well 20, a P-type conductive shallow well (it is referred to as a shallow P-well 21 or it is also referred to as a first shallow well), an N-type conductive shallow well (it is referred to as a shallow N-well 22 or it is also referred to as a second shallow well), a P-type conductive shallow well 23 (it is referred to as a shallow P-well 23 or it is also referred to as a third shallow well), and an N-type conductive shallow well 24 (it is referred to as a shallow N-well 24 or it is also referred to as a fourth shallow well). Further, the semiconductor substrate 30 may include an N-type conductive circling well 35.

The shallow P-well 21 and the shallow N-well 22 are formed in the first region 11, that is, the region in which the deep N-well 20 is formed, when the semiconductor substrate 30 is seen from the principal surface 10. The shallow P-well 21 and the shallow N-well 22 are formed in a part of the semiconductor substrate 30 on the side of the principal surface 10 in such a way that they are in the regions different from each other when they are seen from the principal surface 10. The shallow P-well 21 and the shallow N-well 22 are formed on the deep N-well 20. Accordingly, the semiconductor substrate 30 includes the shallow P-well 21 and the shallow N-well 22 formed in a part shallower than the deep N-well 20 in the depth direction from the principal surface 10.

The circling well 35 may be formed in the side edge (rim part) of the deep N-well 20 on the side of the principal surface along the peripheral edge (perimeter/outer periphery) of the deep N-well 20. Therefore, the circling well 35 may surround the shallow P-well 21 and the shallow N-well 22. The circling well 35 surrounds, for example, the logic region 31 that includes a plurality of shallow P-wells 21 and a plurality of shallow N-wells. The circling well 35 may be formed in accordance with design rules.

The shallow P-well 23 and the shallow N-well 24 are formed in the second region 12, that is, in the region in which the deep N-well 20 is not formed, when the semiconductor substrate 30 is seen from the principal surface 10. The shallow P-well 23 and the shallow N-well 24 are formed in a part of the semiconductor substrate 30 on the side of the principal surface 10 in such a way that they are in the regions different from each other when they are seen from the principal surface 10. The shallow P-well 23 and the shallow N-well 24 are formed on the base material 34. Therefore, the semiconductor substrate 30 includes the shallow P-well 23 and the shallow N-well 24 formed in a part shallower than the base material 34 in the depth direction from the principal surface 10.

The deep N-well 20 is formed in the first region 11. Accordingly, the deep N-well 20 is formed in a region including the shallow P-well 21 and the shallow N-well 22, which is a region other than the region in which the shallow P-well 23 and the shallow N-well 24 are formed, when the semiconductor substrate 30 is seen from the principal surface 10. The semiconductor substrate 30 includes the deep N-well 20 formed in apart deeper than the shallow P-well 21 and the shallow N-well 22 in the depth direction from the principal surface 10.

The base material 34 is formed in a region that includes the shallow P-well 23, the shallow N-well 24, and the deep well 20 when the semiconductor substrate 30 is seen from the principal surface 10. The semiconductor substrate 30 includes the base material 34 formed in a part deeper than the shallow P-well 23, the shallow N-well 24, and the deep well 20 in the depth direction from the principal surface 10.

For example, a plurality of shallow P-wells 21 extended in the X-axis direction are formed in the Y-axis direction with intervals therebetween on the deep N-well 20 in the logic region 31. The shallow N-well 22 is formed between the shallow P-wells 21. Therefore, a plurality of shallow N-wells 22 extended in the X-axis direction are also arranged in the Y-axis direction with intervals therebetween. Accordingly, apart in which the shallow P-wells 21 extended in the X-axis direction and the shallow N-wells 22 extended in the X-axis direction are alternately arranged in the Y-axis direction is included on the deep N-well 20 in the logic region 31.

For example, in the logic region 32, a plurality of shallow P-wells 23 extended in the X-axis direction are arranged in the Y-axis direction with intervals therebetween. The shallow N-well 24 is arranged between the shallow P-wells 23. Accordingly, a plurality of shallow N-wells 24 extended in the X-axis direction are also arranged in the Y-axis direction with intervals therebetween. Accordingly, a part in which the shallow P-wells 23 extended in the X-axis direction and the shallow N-wells 24 extended in the X-axis direction are alternately arranged in the Y-axis direction is included on the base material 34 of the logic region 32.

The shallow P-wells 21 and the shallow N-wells 22 may be formed on the deep N-well 20 also in a region other than the logic region 31 of the first region 11. For example, the plurality of shallow P-wells 21 extended in the X-axis direction and the plurality of shallow N-wells 22 extended in the X-axis direction are alternately arranged in the memory region 33 in the Y-axis direction with intervals therebetween.

In the first region 11, the logic region 31 and the memory region 33 are both included in the semiconductor device 100 in view of the functions and the timing design. From the tendency of the design, the area of the shallow P-well 21 and the area of the shallow P-well 23 when they are seen from the principal surface 10 are large.

An N-type field effect transistor 41 is formed on the shallow P-well 21 of the logic region 31. The field effect transistor 41 is, for example, an NMOS transistor. An N-type diffusion layer N is formed on the respective sides of a gate electrode G of the field effect transistor 41. One of the N-type diffusion layer N is a source and the other one thereof is a drain. In this way, the diffusion layers N of the field effect transistor 41 are formed in a part of the shallow P-well 21 on the side of the principal surface 10.

A P-type field effect transistor 42 is formed on the shallow N-well 22 of the logic region 31. The field effect transistor 42 is, for example, a PMOS. A P-type diffusion layer P is formed on the respective sides of a gate electrode G of the field effect transistor 42. One of the P-type diffusion layer P is a source and the other one thereof is a drain. In this way, the diffusion layers P of the field effect transistor 42 are formed in a part of the shallow N-well 22 on the side of the principal surface 10.

In the logic region 31, a drain electrode D of the field effect transistor 41 and a drain electrode D of the field effect transistor 42 are connected to each other. The field effect transistors 41 and 42 are collectively called a transistor pair Tr1 (the transistor pair Tr1 is also referred to as a first transistor pair). The transistor pair Tr1 includes the field effect transistors 41 and 42. The transistor pair Tr1 is, for example, a CMOS transistor including an NMOS transistor and a PMOS transistor. A plurality of transistor pairs Tr1-Tr3 are formed in the logic region 31.

An N-type field effect transistor 43 is formed on the shallow P-well 23 of the logic region 32. The field effect transistor 43 is, for example, an NMOS transistor. An N-type diffusion layer N is formed on the respective sides of a gate electrode G of the field effect transistor 43. One of the N-type diffusion layer N is a source and the other one thereof is a drain. In this way, the diffusion layers N of the field effect transistor 43 are formed in a part of the shallow P-well 23 on the side of the principal surface 10.

A P-type field effect transistor 44 is formed on the shallow N-well 24 of the logic region 32. The field effect transistor 44 is, for example, a PMOS. A P-type diffusion layer P is formed on the respective sides of a gate electrode G of the field effect transistor 44. One of the P-type diffusion layer P is a source and the other one thereof is a drain. In this way, the diffusion layer P of the field effect transistor 44 are formed in a part of the shallow N-well 24 on the side of the principal surface 10.

In the logic region 32, the gate electrode G of the field effect transistor 43 and the gate electrode G of the field effect transistor 44 are connected to each other. The field effect transistors 43 and 44 are collectively called a transistor pair Tr4 (the transistor pair Tr4 is also referred to as a second transistor pair). The transistor pair Tr4 includes the field effect transistors 43 and 44. The transistor pair Tr4 is, for example, a CMOS transistor including an NMOS transistor and a PMOS transistor. A plurality of transistor pairs Tr4-Tr6 are formed in the logic region 32.

The transistor pair Tr1 and the transistor pair Tr4 are connected to each other. For example, the output of the transistor pair Tr1 and the input of the transistor pair Tr4 are connected to each other. Specifically, the drain electrode D of the transistor pair Tr1 is connected to the gate electrode G of the transistor pair Tr4 by a wire between transistor pairs 61. In a similar way, the transistor pair Tr2 and the transistor pair Tr5, and the transistor pair Tr3 and the transistor pair Tr6 are connected to each other. For example, the output of the transistor pair Tr2 and the input of the transistor pair Tr5 are connected to each other, and the output of the transistor pair Tr3 and the input of the transistor pair Tr6 are connected to each other. Specifically, the drain electrode D of the transistor pair Tr2 is connected to the gate electrode G of the transistor pair Tr5 by the wire between transistor pairs 61. The drain electrode D of the transistor pair Tr3 is connected to the gate electrode G of the transistor pair Tr6 by the wire between transistor pairs 61. The inputs of the transistor pairs Tr1-Tr3 and the outputs of the transistor pairs Tr4-Tr6 may be connected to each other.

As described above, the wire between transistor pairs 61 connects the transistor pairs Tr1-Tr3 and the transistor pairs Tr4-Tr6. From the above discussion, the semiconductor device 100 also includes the transistor pairs Tr1-Tr6 and the wire between transistor pairs 61.

In a process of manufacturing the miniaturized semiconductor device 100, a film-forming process and an etching process may include processing using plasma. Depending on the processing using plasma, the semiconductor substrate 30 may be charged to 6-8 V. As shown in FIGS. 1-3, as the amount of the electric charges accumulated in the deep N-well 20 becomes larger, the potential between the drain electrodes D of the transistor pairs Tr1-Tr3 and the gate electrodes G of the transistor pairs Tr4-Tr6 becomes larger. Accordingly, gate breakdown occurs in the transistor pairs Tr4-Tr6. For example, breakdown occurs in the insulation films of the gate electrodes of the transistor pairs Tr4-Tr6.

As an example of suppressing gate breakdown of the transistor pairs Tr4-Tr6, as shown in FIG. 3, for example, the semiconductor device 100 may include diffusion taps 51 and 52.

The diffusion tap 51 is formed in a part of the shallow P-well 21 on the side of the principal surface 10. The diffusion tap 51 includes a P-type conductive diffusion layer P. The diffusion tap 51 formed on the shallow P-well 21 is connected to an inter-tap wire 62. The diffusion tap 52 is formed in a part of the shallow P-well 23 on the side of the principal surface 10. The diffusion tap 52 includes a P-type conductive diffusion layer P. The diffusion tap 52 formed on the shallow P-well 23 is connected to the inter-tap wire 62. Therefore, the inter-tap wire 62 connects the diffusion tap 51 and the diffusion tap 52.

The wiring layer in which the inter-tap wire 62 is present is arranged to be closer to the semiconductor substrate 30 than the wiring layer in which the wire between transistor pairs 61 is. That is, the wiring layer in which the inter-tap wire 62 is present is below the wiring layer in which the wire between transistor pairs 61 is present.

As described above, since the inter-tap wire 62 is below the wire between transistor pairs 61, the inter-tap wire 62 is formed earlier than the wire between transistor pairs 61. Accordingly, before the drain electrodes D of the transistor pairs Tr1-Tr3 and the gate electrodes G of the transistor pairs Tr4-Tr6 are connected to each other by the wire between transistor pairs 61, processing using plasma may be carried out. Accordingly, the electric charges that are generated by the processing using plasma and are accumulated in the deep N-well 20 can be moved to the base material 34 via the inter-tap wire 62.

However, also in the semiconductor device 100 shown in FIG. 3, gate breakdown may occur in the transistor pairs Tr4-Tr6. In the process of advancing a failure analysis of gate breakdown, the present inventors have found that the phenomenon that gate breakdown occurs has a relation with the area of the shallow P-well 21 in which the diffusion layers N of the transistor pairs Tr1-Tr3 are formed as shown in FIGS. 1 and 2 regardless of the area of the deep N-well 20.

That is, as the area of the shallow P-well 21 formed on the deep N-well 20 becomes larger, the amount of the electric charges charged up becomes larger. Accordingly, gate breakdown occurs in the transistor pairs Tr4-Tr6 connected to the drain electrodes D of the transistor pairs Tr1-Tr3. On the other hand, when the area of the shallow P-well 21 formed on the deep N-well 20 is small, the amount of the electric charges charged up becomes small. It can therefore be considered that gate breakdown of the transistor pairs Tr4-Tr6 connected to the drain electrodes D of the transistor pairs Tr1-Tr3 is suppressed.

Figures 4, 5:
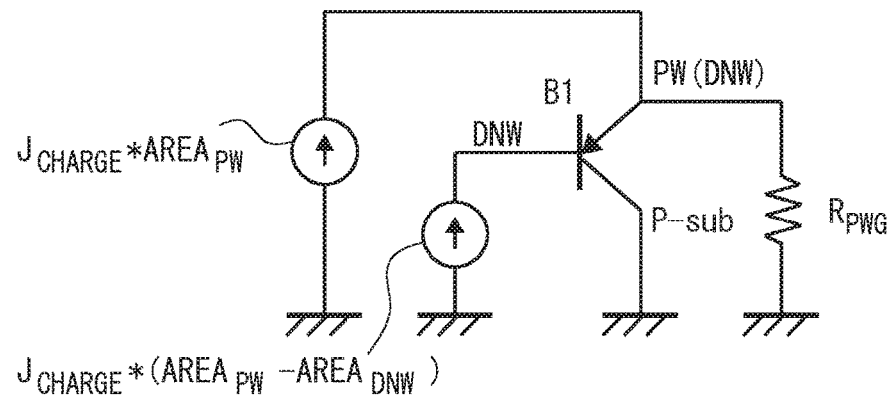
FIG. 4 is a circuit diagram illustrating a parasitic bipolar formed in the semiconductor device and shows an equivalent circuit having the structure of the semiconductor device shown in FIG. 3.
FIG. 5 is a diagram illustrating results of a simulation of gate breakdown of the semiconductor device.

In order to confirm the above findings, an equivalent circuit having a structure shown in FIG. 3 is created, and a simulation is conducted using the equivalent circuit that has been created. FIG. 4 is a circuit diagram illustrating a parasitic bipolar B1 formed in the semiconductor device 100, and shows an equivalent circuit having the structure of the semiconductor device 100 shown in FIG. 3.

As shown in FIGS. 3 and 4, the base, the emitter, and the collector of the parasitic bipolar B1 are formed by the deep N-well 20, the shallow P-well 21, and the base material 34. It can be considered that the amount of the electric charges that move between the transistor pair Tr1 and the transistor pair Tr4 depends on the amount of the electric charges accumulated in the shallow P-well 21 and the amount of the electric charges accumulated in the deep N-well 20. Using this structure, gate breakdown of the semiconductor device 100 is simulated.

FIG. 5 is a diagram illustrating results of simulating gate breakdown of the semiconductor device 100. In FIG. 5, the current density charged up is set to 0.1 A/m$^2$. The DN-well area shown in FIG. 5 is the area of the deep N-well 20. The P-well area shown in FIG. 5 is the area of the shallow P-well 21 in which the diffusion layer N of the field effect transistor 41 is formed. The resistance $R_{PWG}$ is a parameter when the simulation is conducted, and shows a resistance of the path in which accumulated charges flow as a current. In FIG. 5, OK indicates that gate breakdown is suppressed and NG indicates that gate breakdown occurs.

When an analysis chip A is used, the area of the deep N-well 20 is 7.5×10$^7$ [μm$^2$], and the area of the shallow P-well 21 is 2.6×10$^7$ [μm$^2$]. When the occurrence of gate breakdown is simulated regarding the analysis chip A, when the resistance $R_{PWG}$ is as small as about 1 [kΩ], gate breakdown is suppressed (OK). When the resistance $R_{PWG}$ is as large as about 1 [MΩ], gate breakdown occurs (NG). When the resistance $R_{PWG}$ is almost infinite like 300 [MΩ], gate breakdown occurs (NG). In this way, when the area of the shallow P-well 21 is large, gate breakdown occurs unless the resistance $R_{PWG}$ is suppressed to be small. These results show that it is difficult to suppress gate breakdown.

When an analysis chip B is used, the area of the deep N-well 20 is 7.2×10$^2$ [μm$^2$], and the area of the shallow P-well 21 is 2.5×10$^5$ [μm$^2$]. When the occurrence of gate breakdown is simulated regarding the analysis chip B, when the resistance $R_{PWG}$ is as small as about 1 [kΩ], gate breakdown is suppressed (OK). When the resistance $R_{PWG}$ is as large as about 1 [MΩ], gate breakdown is suppressed (OK). When the resistance $R_{PWG}$ is almost infinite like 300 [MΩ], gate breakdown occurs (NG). Even in this case as well, the area of the shallow P-well 21 is large. Therefore, gate breakdown occurs unless the resistance $R_{PWG}$ is suppressed to be small. These results show that it is difficult to suppress gate breakdown.

When an analysis chip C is used, the area of the deep N-well 20 is 3.5×10$^7$ [μm$^2$], and the area of the shallow P-well 21 is 8.8×10$^3$ [μm$^2$]. When the occurrence of gate breakdown is simulated regarding the analysis chip C, when the resistance $R_{PWG}$ is as small as about 1 [kΩ], gate breakdown is suppressed (OK). When the resistance $R_{PWG}$ is as large as about 1 [MΩ], gate breakdown is suppressed (OK). When the resistance $R_{PWG}$ is almost infinite like 300 [MΩ], gate breakdown is suppressed (OK). When the area of the shallow P-well 21 is small, gate breakdown can be suppressed.

As described above, as the area of the shallow P-well 21 formed on the deep N-well becomes larger, gate breakdown of the transistor pairs Tr4-Tr6 occurs. Therefore, it can be considered that the amount of the electric charges charged up in the shallow P-well 21 and the deep N-well 20 becomes larger as the area of the shallow P-well 21 becomes larger. Therefore, it can be considered that the amount of the electric charges that have been charged up can be reduced if the area of the shallow P-well 21 is reduced. Accordingly, it can be considered that gate breakdown of the transistor pairs Tr4-Tr6 can be suppressed. The embodiments described below are based on the aforementioned findings.

First Embodiment

Figure 6:
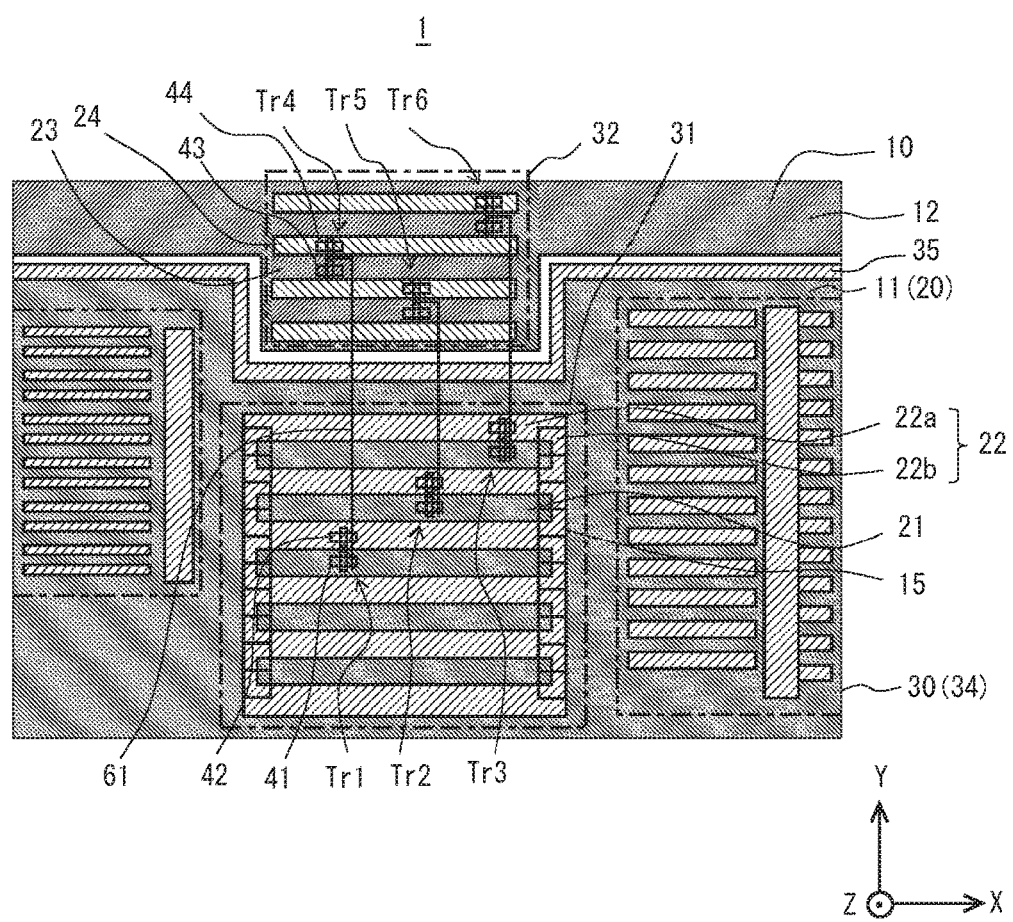
FIG. 6 is a plan view illustrating the semiconductor device according to the first embodiment.

Next, a semiconductor device 1 according to a first embodiment will be explained. FIG. 6 is a plan view illustrating the semiconductor device 1 according to the first embodiment. The semiconductor device 1 shown in FIG. 6 is an enlarged view of a part that corresponds to the A region of the semiconductor device 100 shown in FIG. 1. Similar to the semiconductor device 100, the semiconductor device 1 also includes a first region 11 and a second region 12. A semiconductor substrate 30 in the first region 11 includes a deep N-well 20 (deep well).

Further, the semiconductor substrate 30 includes a shallow P-well 21 (a first shallow well), a shallow N-well 22 (a second shallow well), a shallow P-well 23 (a third shallow well), and a shallow N-well 24 (a fourth shallow well) formed in a part of the semiconductor substrate 30 on the side of the principal surface 10 in such away that they are in regions different from one another when the semiconductor substrate 30 is seen from the principal surface 10. Further, the semiconductor substrate 30 may include an N-type conductive circling well 35.

The deep N-well 20 is formed in a region including the shallow P-well 21 and the shallow N-well 22, which is a region other than the region in which the shallow P-well 23 and the shallow N-well 24 are formed. The semiconductor substrate 30 includes the deep N-well 20 formed in a part deeper than the shallow P-well 21 and the shallow N-well 22 in the depth direction from the principal surface 10.

The circling well 35 may be formed in the side edge (rim part) of the deep N-well 20 on the side of the principal surface along the peripheral edge (perimeter/outer periphery) of the deep N-well 20. Therefore, the circling well 35 may surround the shallow P-well 21 and the shallow N-well 22. The circling well 35 surrounds, for example, the logic region 31 that includes a plurality of shallow P-wells 21 and a plurality of shallow N-wells. The circling well 35 may be formed in accordance with design rules.

The structures of the shallow P-well 21 and the shallow N-well 22 formed in the first region 11 in the semiconductor device 1 according to the first embodiment are different from those in the semiconductor device 100. As shown in FIG. 6, a plurality of shallow P-wells 21 are formed on the deep N-well 20 of the logic region 31. The plurality of shallow P-wells 21 are extended in the X-axis direction and are aligned along the Y-axis direction.

The shallow N-well 22 includes a plurality of parts 22a, extended in the X-axis direction, formed between the shallow P-wells 21 and a part 22b extended in the Y-axis direction in the respective end sides of the shallow P-wells 21 in the X-axis direction. The shallow N-well 22 is integrated by a connection of the part 22a and the part 22b. Accordingly, the shallow N-well 22 is arranged in such a way as to surround the peripheral edge of the region of the shallow P-wells 21.

For example, the shape of the shallow P-well 21 and the shallow N-well 22 formed in the +X-axis direction and the −X-axis direction of each of the shallow P-wells 21 reflects a boundary cell 15 used in the layout design.

Figure 7:
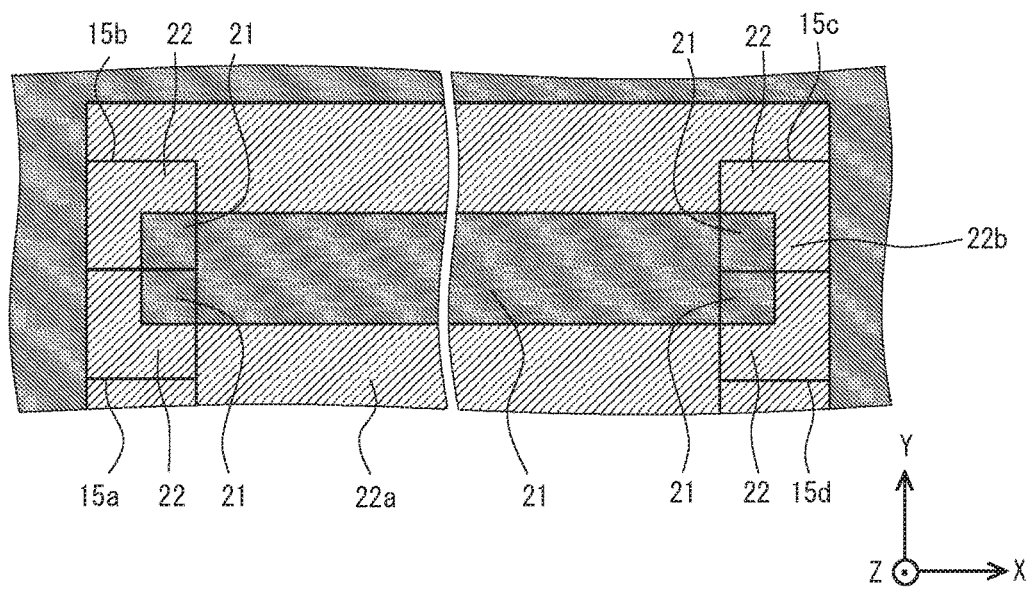
FIG. 7 is a plan view illustrating a boundary cell according to the first embodiment.

FIG. 7 is a plan view illustrating the boundary cell 15 according to the first embodiment. As shown in FIGS. 6 and 7, when the shallow P-well 21 and the shallow N-well 22 are formed, a layout design is performed in advance. A cell is used for the layout design. The boundary cell 15 has, for example, a rectangular shape when it is seen from the +Z-axis direction. A part of the shallow P-well 21 is formed in the vicinity of one of the four angles of the rectangular boundary cell 15. The part of the boundary cell 15 other than the shallow P-well 21 is the shallow N-well 22. As discussed above, the boundary cell 15 includes the part of the shallow P-well 21 and the part of the shallow N-well 22.

As shown in FIG. 7, in a boundary cell 15a, the shallow P-well 21 is arranged in the vicinity of the angle formed by the side in the +X-axis direction and the side in the +Y-axis direction. In a boundary cell 15b, the shallow P-well 21 is arranged in the vicinity of the angle formed by the side in the +X-axis direction and the side in the −Y-axis direction. In a boundary cell 15c, the shallow P-well 21 is arranged in the vicinity of the angle formed by the side in the −X-axis direction and the side in the −Y-axis direction. A boundary cell 15d includes the shallow P-well 21 arranged near the angle formed by the side in the −X-axis direction and the side in the +Y-axis direction.

When the boundary cell 15a is mirror-reflected with respect to the X axis, the boundary cell 15b is obtained. When the boundary cell 15a is rotated by 180° about the Z axis, which is the rotation axis; that is, when the boundary cell 15a is mirror-reflected with respect to the X axis and the Y axis, the boundary cell 15c is obtained. When the boundary cell 15a is mirror-reflected with respect to the Y axis, the boundary cell 15d is obtained.

The boundary cell 15a and the boundary cell 15b are bonded to each other in such a way that they are adjacent to each other in the Y-axis direction. In this case, the part of the shallow P-well 21 is formed in the central part of the side in the +X-axis direction of the boundary cell 15a and the boundary cell 15b that have been bonded to each other. The length of this part in the Y-axis direction is the same as the length of the shallow P-well 21 in the Y-axis direction. The boundary cell 15a and the boundary cell 15b that have been bonded to each other are arranged in the −X-axis direction of the shallow P-well 21. In this case, these boundary cells are arranged in such a way that the part of the shallow P-well 21 in the central part of the side coincides with the end part in the −X-axis direction of the shallow P-well 21.

Further, the boundary cell 15c and the boundary cell 15d are bonded to each other in such a way that they are adjacent to each other in the Y-axis direction. In this case, the part of the shallow P-well 21 is formed in the central part of the side in the −X-axis direction of the boundary cell 15c and the boundary cell 15d that have been bonded to each other. The length of this part in the Y-axis direction is the same as the length of the shallow P-well 21 in the Y-axis direction. The boundary cell 15c and the boundary cell 15d that have been bonded to each other are arranged in the +X-axis direction of the shallow P-well 21. In this case, these boundary cells are arranged in such a way that the part of the shallow P-well 21 in the central part of the side coincides with the end part in the +X-axis direction of the shallow P-well 21.

The boundary cell 15a and the boundary cell 15b that have been bonded to each other and the boundary cell 15c and the boundary cell 15d that have been bonded to each other are arranged in the respective end parts of the shallow P-well 21 in the X-axis direction. Accordingly, the shallow N-well 22 is arranged around the perimeter of the region of the shallow P-well 21. Therefore, the perimeter of the shallow P-well 21 is surrounded by the shallow N-well 22. In this way, the shallow N-well 22 separates the shallow P-well 21 from another shallow P-well 21.

As described above, since the shallow N-well 22 surrounds the shallow P-well 21, the area of the shallow P-well 21 can be made smaller than a predetermined area. The predetermined area is determined, for example, in accordance with the design conditions of the semiconductor device 1.

Figure 8:
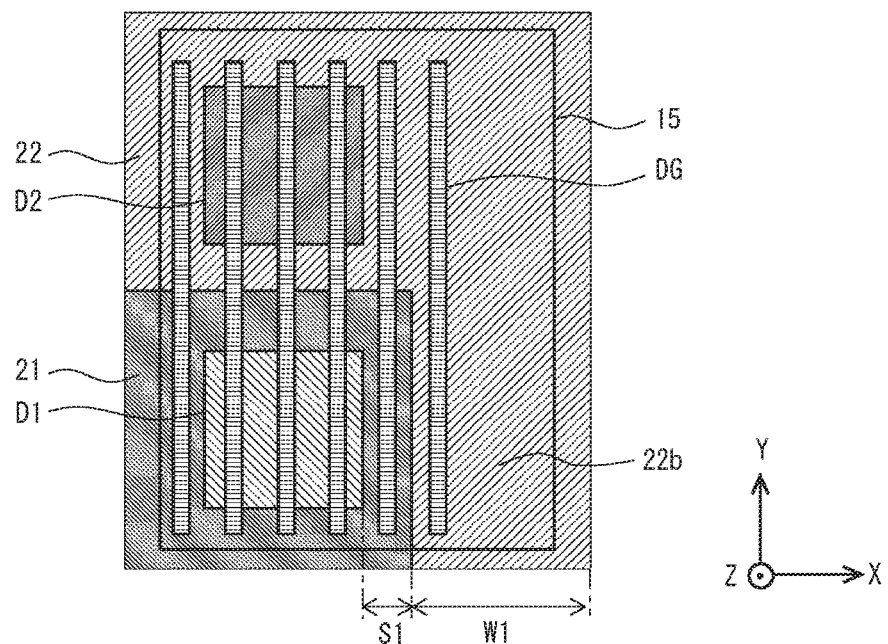
FIG. 8 is a plan view illustrating the boundary cell according to the first embodiment.

Now, the shape of the boundary cell 15 will be explained. FIG. 8 is a plan view illustrating the boundary cell 15 according to the first embodiment. As shown in FIG. 8, in the rectangular boundary cell 15, the shallow P-well 21 is formed near one of the four corners thereof. The shallow N-well 22 is formed in another part of the rectangular boundary cell 15. A dummy diffusion layer D1 is arranged in a part of the shallow P-well 21 of the boundary cell 15. A dummy diffusion layer D2 is arranged in the +Y-axis direction of the dummy diffusion layer D1 in the shallow N-well 22. A plurality of dummy gate layers DG extended in the Y-axis direction are arranged in such a way that they span the part of the shallow P-well 21 and the part of the shallow N-well 22 in the boundary cell 15.

In the manufacturing process of the miniaturized semiconductor device, device characteristics fluctuate greatly in layout dependent effects (LDE). When the shallow N-well 22 is arranged in such a way as to surround the shallow P-well 21 in consideration of the LDE, the amount of the increase in the area is made minimum. Therefore, the boundary cell 15 is arranged in the FILL cell in which the LDE has already been taken into consideration. Accordingly, the length S1 between the dummy diffusion layer D1 and the shallow N-well 22 can be made minimum in accordance with the layout rules. Further, the length W1 in the X-axis direction of the part 22b of the shallow N-well 22 extended in the Y-axis direction can be made minimum in accordance with the layout rules.

Similar to the semiconductor device 100 shown in FIG. 3, in the semiconductor device 1 shown in FIG. 6, the diffusion layer N of the field effect transistor 41 is formed in a part of the shallow P-well 21 on the side of the principal surface 10, and the diffusion layer P of the field effect transistor 42 is formed in a part of the shallow N-well 22 on the side of the principal surface 10. The transistor pair Tr1 (the first transistor pair) includes the field effect transistors 41 and 42. The wire between transistor pairs 61 connects the first transistor pair and the second transistor pair. For example, the wire between transistor pairs 61 connects the output of the first transistor pair and the input of the second transistor pair. Specifically, the drain electrode D of the transistor pair Tr1 is connected to the gate electrode G of the transistor pair Tr4 by the wire between transistor pairs 61. In a similar way, the transistor pair Tr2 and the transistor pair Tr5, and the transistor pair Tr3 and the transistor pair Tr6 are connected to each other. For example, the output of the transistor pair Tr2 and the input of the transistor pair Tr5 are connected to each other, and the output of the transistor pair Tr3 and the input of the transistor pair Tr6 are connected to each other. To be more specific, the wire between transistor pairs 61 connects the drain electrodes D of the transistor pairs Tr1-Tr3 and the gate electrodes G of the transistor pairs Tr4 (second transistor)-Tr6. The wire between transistor pairs 61 may connect the inputs of the transistor pairs Tr1-Tr3 and the outputs of the transistor pairs Tr4-Tr6. In this embodiment, the diffusion taps 51 and 52 shown in FIG. 3 may or may not be formed. The other structures may be similar to those of the semiconductor device 100.

According to this embodiment, the area of the shallow P-well 21 can be made smaller than the predetermined area. Accordingly, gate breakdown of the transistor pairs Tr4-Tr6 can be suppressed. It can be considered that this is because, when the area of the shallow P-well 21 is small, the amount of the electric charges charged up in the shallow P-well 21 and the deep N-well 20 can be made small.

According to the above consideration, the wire between transistor pairs 61 may connect the field effect transistor 41 (the first field effect transistor) and the field effect transistor 43 (the second field effect transistor) or the field effect transistor 44 (the third field effect transistor). In this way, even when the field effect transistors 41 and 42 formed on the deep N-well 20 and the field effect transistors 43 and 44 formed on the base material 34 do not have a structure of a complementary-type transistor, it can be considered that breakdown of the field effect transistor 43 or the field effect transistor 44 can be suppressed since the area of the shallow P-well 21 is small.

The wire between transistor pairs 61 may connect the output of the field effect transistor 41 and the input of the field effect transistor 43 or the field effect transistor 44, or may connect the drain electrode of the field effect transistor 41 and the gate electrode of the field effect transistor 43 or the field effect transistor 44.

Further, by using the boundary cells 15a-15d, the shallow P-well 21 and the shallow N-well 22 can be easily laid out in the layout process in compliance with the layout rules.

Second Embodiment

Figure 9:
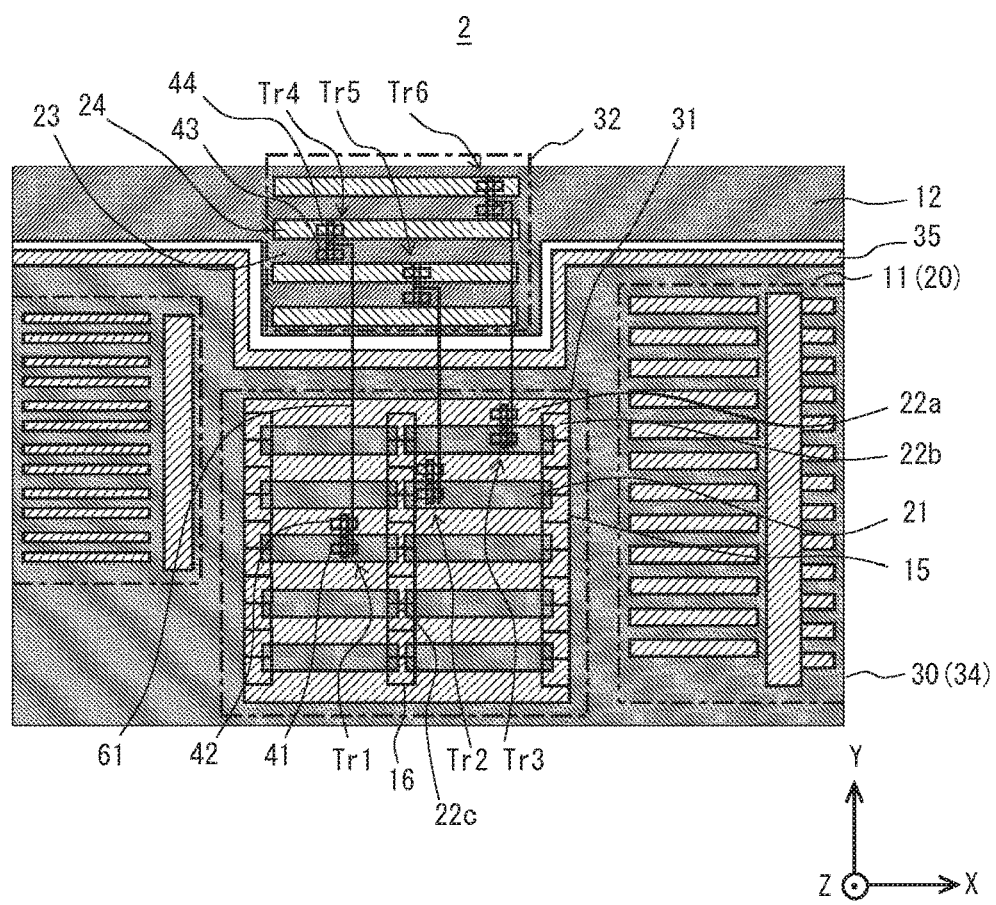
FIG. 9 is a plan view illustrating a semiconductor device according to a second embodiment.

Next, a semiconductor device according to a second embodiment will be explained. FIG. 9 is a plan view illustrating the semiconductor device according to the second embodiment. As shown in FIG. 9, in the semiconductor device 2, a plurality of shallow P-wells 21 are formed on the deep N-well 20 of the logic region 31. A plurality of shallow P-wells 21 are formed in such a way that they are extended in the X-axis direction and are aligned along the X-axis direction. Alternatively, the plurality of shallow P-wells 21 may be aligned also along the Y-axis direction as well.

The shallow N-wells 22 are formed on the respective sides in the Y-axis direction of the shallow P-well 21 in such a way as to hold the shallow P-well 21 therebetween, and includes a part 22a extended in the X-axis direction. Further, the shallow N-well 22 includes a part 22b extended in the Y-axis direction in the respective end sides of the shallow P-well 21 in the X-axis direction. Further, the shallow N-well 22 also includes a part 22c arranged between the shallow P-wells 21 arranged in the X-axis direction. The shallow N-well 22 is integrated by a connection of the part 22a, the part 22b, and the part 22c.

For example, in the part between the shallow P-wells 21 formed in such a way that they are aligned with each other in the X-axis direction, the shape of the shallow P-well 21 and the shallow N-well 22 reflects the bridge cell 16 used in the layout design.

Figure 10:
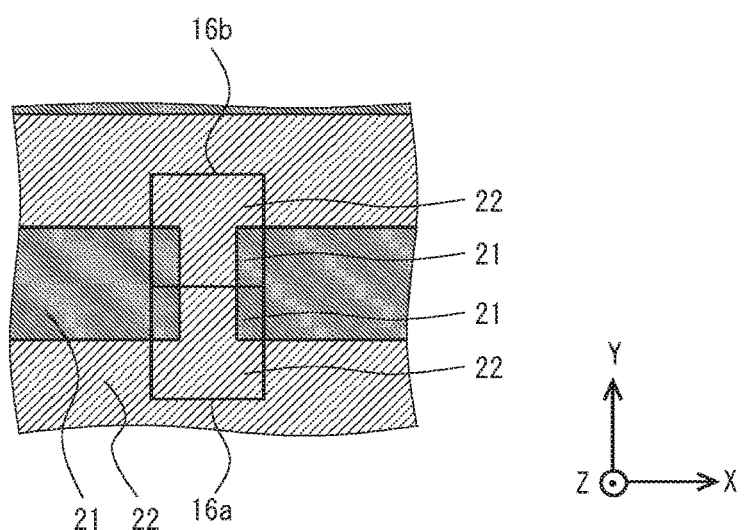
FIG. 10 is a plan view illustrating a bridge cell according to the second embodiment.

FIG. 10 is a plan view illustrating the bridge cell according to the second embodiment. As shown in FIGS. 9 and 10, the bridge cell 16 has a rectangular shape when it is seen from the +Z-axis direction. The shallow P-well 21 is arranged near two adjacent angles among four angles of the rectangular bridge cell 16. The part of the bridge cell 16 other than the shallow P-well 21 is the shallow N-well 22. In this way, the bridge cell 16 includes the part of the shallow P-well 21 and the part of the shallow N-well 22.

In a bridge cell 16a, the shallow P-well 21 is arranged in the vicinity of the angle formed by the side in the +X-axis direction and the side in the +Y-axis direction and the angle formed by the side in the −X-axis direction and the side in the +Y-axis direction. In a bridge cell 16b, the shallow P-well 21 is arranged in the vicinity of the angle formed by the side in the +X-axis direction and the side in the −Y-axis direction and the angle formed by the side in the −X-axis direction and the side in the −Y-axis direction. When the bridge cell 16a is rotated by 180° in the clockwise direction about the Z axis, which is the rotation axis, on the XY plane, the bridge cell 16b can be obtained.

The bridge cell 16a and the bridge cell 16b are bonded to each other in such a way that they are adjacent to each other in the Y-axis direction. In this case, the part of the shallow P-well 21 is arranged in the central part of the side of the bridge cell 16a and the bridge cell 16b that have been bonded to each other in the +X-axis direction and the central part of the side thereof in the −X-axis direction. The length of the part of the shallow P-well 21 in the Y-axis direction is the same as the length of the shallow P-well 21 in the Y-axis direction. The bridge cell 16a and the bridge cell 16b that have been bonded to each other are arranged in the central part of the shallow P-well 21 in the X-axis direction. In this case, these bridge cells are arranged in such a way that the part of the shallow P-well 21 of the central part of the side coincides with the width of the shallow P-well 21 in the Y-axis direction.

The bridge cell 16a and the bridge cell 16b that have been bonded to each other are arranged in the central part of the shallow P-well 21 in the X-axis direction, whereby the part 22c of the shallow N-well 22 divides the shallow P-well 21 in the X-axis direction. Then the shallow N-well 22 is arranged around the perimeter in the region of the shallow P-well 21. Accordingly, the perimeter of the shallow P-well 21 is surrounded by the shallow N-well 22. In this way, the shallow N-well 22 separates the shallow P-well 21 from another shallow P-well 21.

As described above, the shallow N-well 22 formed on the deep N-well 20 surrounds the shallow P-well 21. Accordingly, the area of the shallow P-well 21 can be made smaller than the predetermined area. The predetermined area is determined by, for example, the design conditions of the semiconductor device 2.

Figure 11:
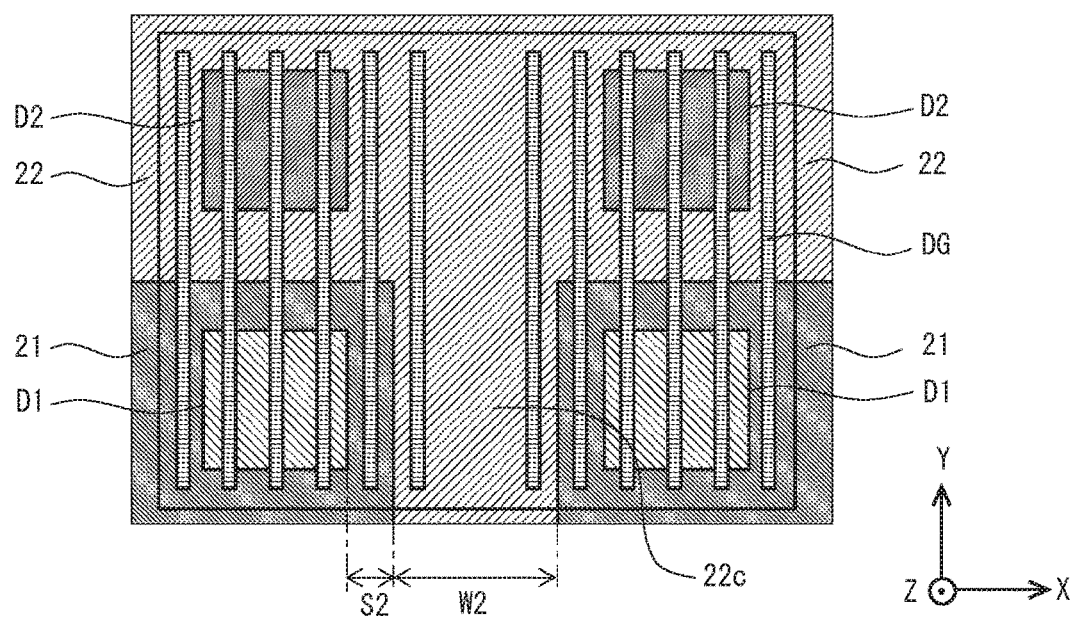
FIG. 11 is a plan view illustrating the bridge cell according to the second embodiment.

Now, the shape of the bridge cell 16 will be explained. FIG. 11 is a plan view illustrating the bridge cell 16 according to the second embodiment. As shown in FIG. 11, in the rectangular bridge cell 16, the shallow P-well 21 is formed in the vicinity of two adjacent angles among the four angles. The shallow N-well 22 is formed in another part. The dummy diffusion layer D1 is arranged in a part of the shallow P-well 21 of the bridge cell 16. The dummy diffusion layer D2 is arranged in the +Y-axis direction of the dummy diffusion layer D1 in the shallow N-well 22. A plurality of dummy gate layers DG extended in the Y-axis direction are arranged in such a way that they span the part of the shallow P-well 21 and the part of the shallow N-well 22 in the bridge cell 16.

In this embodiment as well, the bridge cell 16 is arranged in the FILL cell in which the LDE has already been taken into consideration. Accordingly, the length S2 between the dummy diffusion layer D1 and the shallow N-well 22 can be made minimum in accordance with the layout rules. Further, the length W2 in the X-axis direction of the part 22c of the shallow N-well 22 arranged between the shallow P-wells 21 can be made minimum in accordance with the layout rules.

Similar to the semiconductor device 100 shown in FIG. 3, in the semiconductor device 2 shown in FIG. 9, the diffusion layer N of the field effect transistor 41 is formed in a part of the shallow P-well 21 on the side of the principal surface 10, and the diffusion layer P of the field effect transistor 42 is formed in a part of the shallow N-well 22 on the side of the principal surface 10. The transistor pair Tr1 includes the field effect transistors 41 and 42. The wire between transistor pairs 61 connects the drain electrodes D of the transistor pairs Tr1-Tr3 and the gate electrodes G of the transistor pairs Tr4-Tr6. In this embodiment, the diffusion taps 51 and 52 shown in FIG. 3 may or may not be formed. The other structures may be similar to those of the semiconductor device 100 and the semiconductor device 1.

According to this embodiment, the area of the shallow P-well 21 can be made smaller than the area thereof in the first embodiment. Even with the structure of the first embodiment, when the area of the shallow P-well 21 cannot be made smaller than the predetermined area, the shallow P-well 21 can be divided by using the bridge cells 16a and 16b according to the second embodiment. Accordingly, the area of the shallow P-well 21 can be made smaller than the predetermined area. Accordingly, gate breakdown can be suppressed. Further, by using the bridge cells 16a and 16b, the shallow P-well 21 and the shallow N-well 22 can be easily laid out in the layout process in compliance with the layout rules. The other effects are included in the description of the first embodiment.

Modified Example

Figure 12:
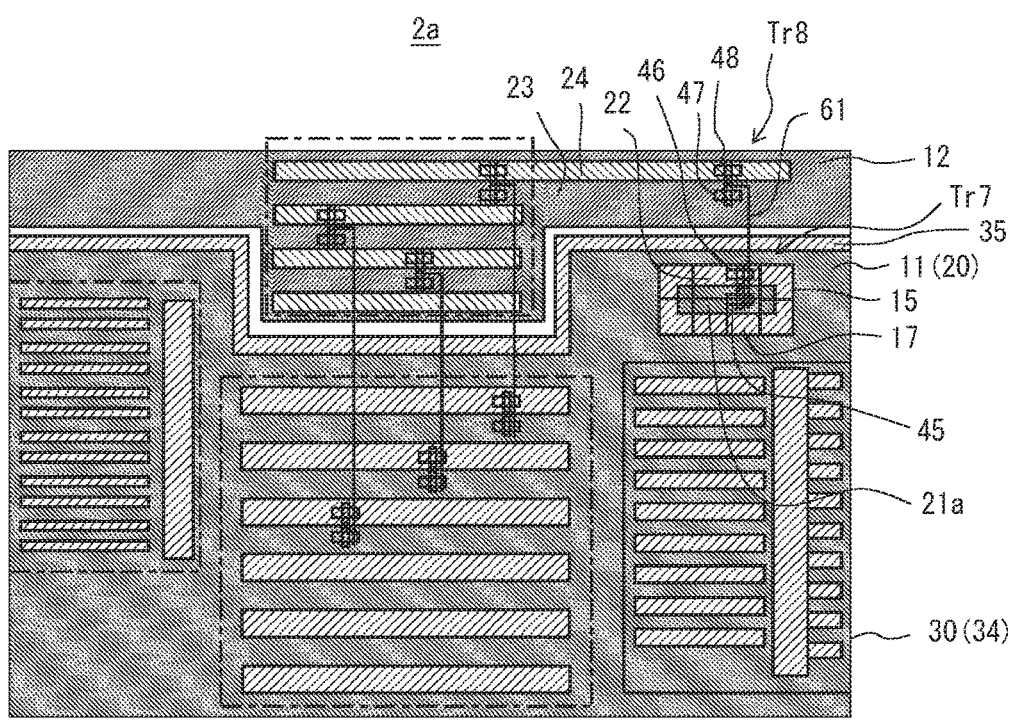
FIG. 12 is a plan view illustrating a semiconductor device according to a modified example of the second embodiment.
Figure 13:
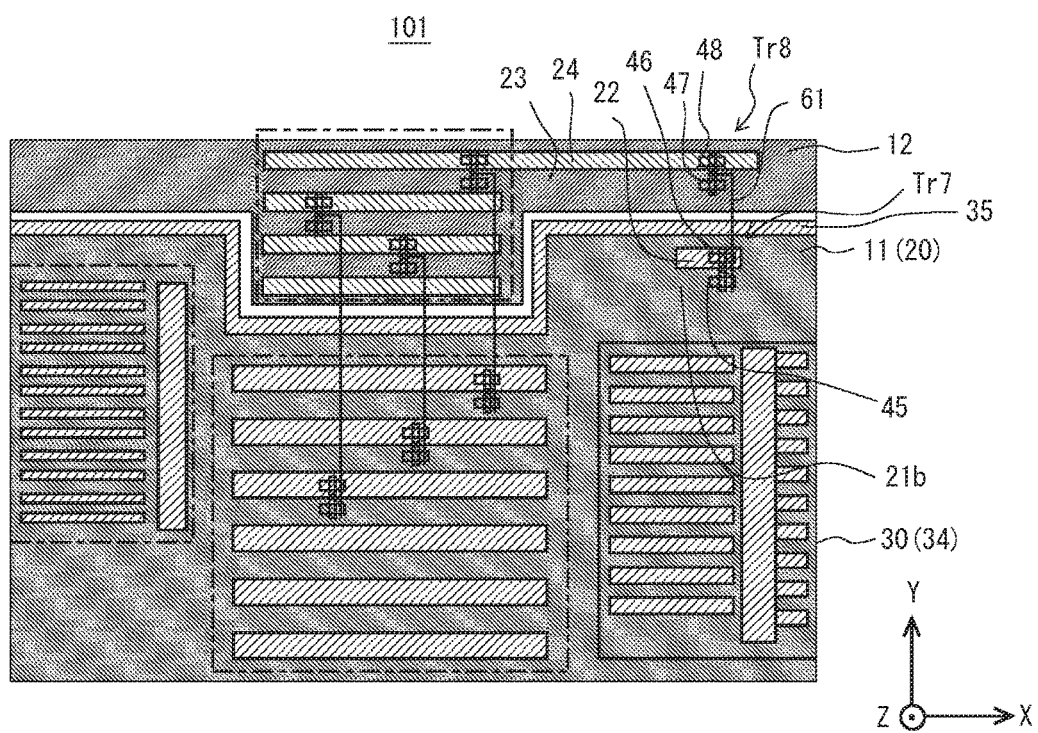
FIG. 13 is a plan view illustrating a semiconductor device according to a comparative example.

Next, a modified example of the second embodiment will be explained. This modified example is an example in which a surrounding cell is used. FIG. 12 is a plan view illustrating a semiconductor device according to the modified example of the second embodiment. FIG. 13 is a plan view illustrating a semiconductor device according to a comparative example.

As shown in FIG. 12, in a semiconductor device 2a according to the modified example, a shallow P-well 21a surrounded by the shallow N-well 22 is formed on the deep N-well 20 in the first region 11. A part of the shallow P-well 21a in the side of the +X-axis direction and the side of the −X-axis direction has a shape of the shallow P-well 21 and the shallow N-well 22 that reflect the boundary cell 15. Further, a part of the shallow P-well 21a in the −Y-axis direction has a shape of the shallow P-well 21 and the shallow N-well 22 that reflects a surrounding cell 17.

The surrounding cell 17 has, for example, a rectangular shape. In the surrounding cell 17, the shallow P-well 21 is arranged in the half of the cell area in the side of the +Y-axis direction and the shallow N-well 22 is arranged in the half of the cell area in the side of the −Y-axis direction. The surrounding cell 17 is arranged in the −Y-axis direction of the shallow N-well 22 in such a way as to sandwich the shallow P-well 21 between the shallow N-wells 22 extended in the X-axis direction. According to this arrangement, the shallow P-well 21a extended in the X-axis direction is formed between the shallow N-wells 22.

Then the boundary cell 15 is arranged in the side of the +X-axis direction and the side of the −X-axis direction of the shallow P-well 21 extended in the X-axis direction. Accordingly, the shallow N-well 22 can be arranged around the peripheral edge of the region of the shallow P-well 21a. In the surrounding cell 17, the shallow P-well 21 may be arranged in the half of the cell area in the side of the −Y-axis direction, and the shallow N-well 22 may be arranged in the half of the cell area in the +Y-axis direction. The number of surrounding cells 17 aligned along the X-axis direction depends on the length of the shallow N-well 22.

As described above, the shallow N-well 22 surrounds the shallow P-well 21a. Accordingly, the area of the shallow P-well 21a can be made smaller than the predetermined area. The predetermined area is determined by, for example, the design conditions of the semiconductor device 2a.

As shown in FIG. 12, a field effect transistor 45 is formed in a part of the shallow P-well 21a on the side of the principal surface 10, and a field effect transistor 46 is formed in a part of the shallow N-well 22 on the side of the principal surface 10. A transistor pair Tr7 includes field effect transistors 45 and 46.

A field effect transistor 47 is formed in a part of the shallow P-well 23 on the side of the principal surface 10 in the second region 12, and a field effect transistor 48 is formed in apart of the shallow N-well 24 on the side of the principal surface 10 in the second region 12. A transistor pair Tr8 includes field effect transistors 47 and 48.

The wire between transistor pairs 61 connects a drain electrode D of the transistor pair Tr7 and a gate electrode G of the transistor pair Tr8. In this modification as well, the diffusion taps 51 and 52 shown in FIG. 3 may or may not be formed. The other structures may be similar to those of the semiconductor device 100 and the semiconductor devices 1 and 2.

According to this modified example, the area of the shallow P-well 21a in which the diffusion layer of the field effect transistor 45 is formed can be made smaller than the predetermined area. It is therefore possible to suppress gate breakdown of the transistor pair Tr8.

On the other hand, as shown in FIG. 13, in a semiconductor device 101 according to the comparative example, one shallow N-well 22 extended in the X-axis direction is formed on the deep N-well 20. The shallow P-well 21b is extended around the shallow N-well 22. The shallow P-well 21b may also serve as the shallow P-well 21 in another area such as a memory region.

In the comparative example, the shallow P-well 21b and the shallow N-well 22 are not formed to have a stripe shape. Therefore, the boundary cell 15 and the bridge cell 16 alone are not sufficient to surround the peripheral edge of the shallow P-well 21b by the shallow N-well 22. Therefore, the area of the shallow P-well 21b cannot be made smaller than the predetermined area. Therefore, it is impossible to prevent gate breakdown of the transistor pair Tr8.

Third Embodiment

Figure 14:
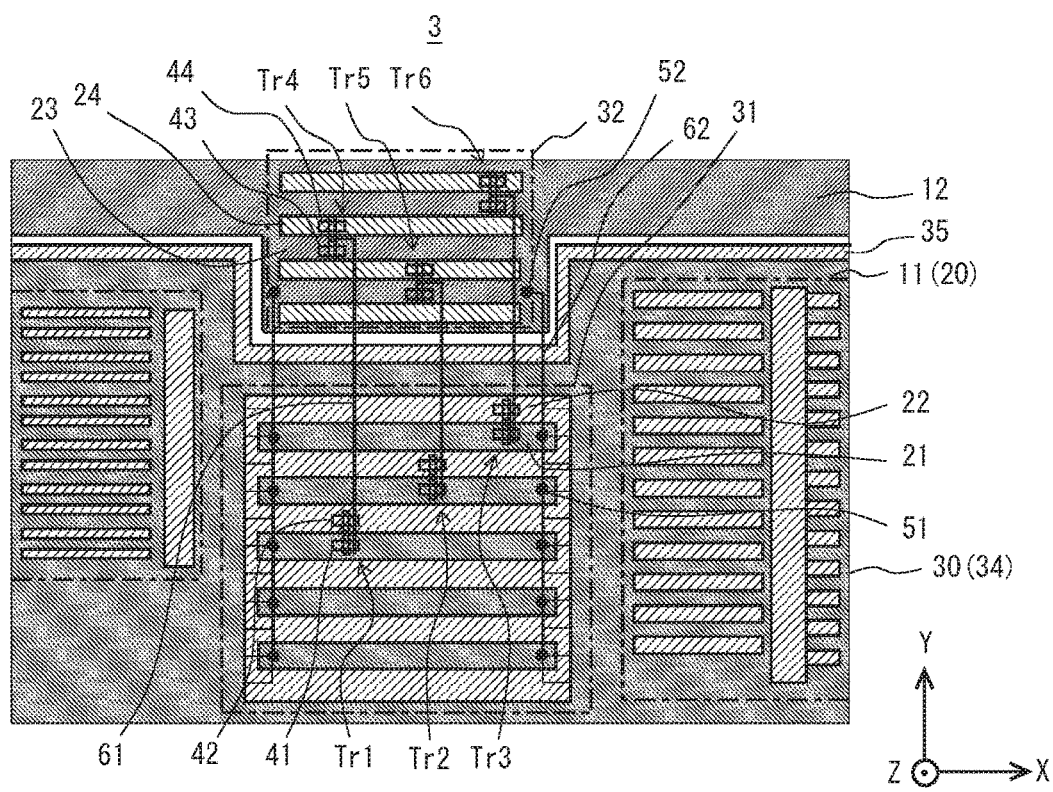
FIG. 14 is a plan view illustrating a semiconductor device according to a third embodiment.

Next, a semiconductor device according to a third embodiment will be explained. FIG. 14 is a plan view illustrating the semiconductor device according to the third embodiment. As shown in FIG. 14, a semiconductor device 3 includes a diffusion tap 51 (a first diffusion tap) and a diffusion tap 52 (a second diffusion tap). The diffusion taps 51 and 52 each include a P-type conductive diffusion layer. The diffusion tap 51 is formed in a part of the shallow P-well 21 on the side of the principal surface 10. Further, the diffusion tap 52 is formed in a part of the shallow P-well 23 on the side of the principal surface 10. Then the diffusion tap 51 and the diffusion tap 52 are connected to each other by the inter-tap wire 62 (a first inter-tap wire). The wiring layer in which the inter-tap wire 62 is present is arranged to be closer to the semiconductor substrate 30 than the wiring layer in which the wire between transistor pairs 61 is present is.

Therefore, before the transistor pairs Tr1-Tr3 and the transistor pairs Tr4-Tr6 are connected to each other by the wire between transistor pairs 61, specifically, as one example, before the drain electrodes D of the transistor pairs Tr1-Tr3 and the gate electrodes G of the transistor pairs Tr4-Tr6 are connected to each other by the wire between transistor pairs 61, processing using plasma can be performed. The electric charges that are generated by the processing using plasma and are accumulated in the deep N-well 20 and the shallow P-well 21 can be moved to the base material 34 via the inter-tap wire 62.

By moving the electric charges by the inter-tap wire 62, the area of the shallow P-well 21 can be made larger than the predetermined area used in the first and second embodiments. When they are not connected to each other by the inter-tap wire 62, the electric charges are kept to be accumulated in the deep N-well 20 and the shallow P-well 21. When the drain electrodes D of the transistor pairs Tr1-Tr3 and the gate electrodes G of the transistor pairs Tr4-Tr6 are connected to each other, electric charges flow through the transistor pairs Tr1-Tr3.

When the area of the shallow P-well 21 is smaller than the predetermined first threshold as in the first and second embodiments, it can be considered that the amount of electric charges accumulated in the deep N-well 20 and the shallow P-well 21 is small. Therefore, when the area is smaller than the first threshold, gate breakdown can be suppressed.

On the other hand, according to this embodiment, the area of the shallow P-well 21 can be expanded to a second threshold larger than the first threshold. In this way, the second threshold can be made larger than the first threshold, whereby it is possible to broaden the design choices. It is therefore possible to efficiently use the principal surface 10 of the semiconductor device 3.

The diffusion tap 51 is provided in the end in the X-axis direction of the shallow P-wells 21 extended in the X-axis direction. For example, a lower wiring layer among various wiring layers formed in a part of the shallow P-well 21 on the side of the principal surface 10 is used for elements such as a buffer and a NAND. Accordingly, by forming the diffusion tap 51 in the end of the shallow P-well 21 in the X-axis direction, it is possible to avoid physical contact with these elements and to enhance the degree of freedom of the arrangement of the elements. The other effects are included in the description of the first and second embodiments.

Fourth Embodiment

Figure 15:
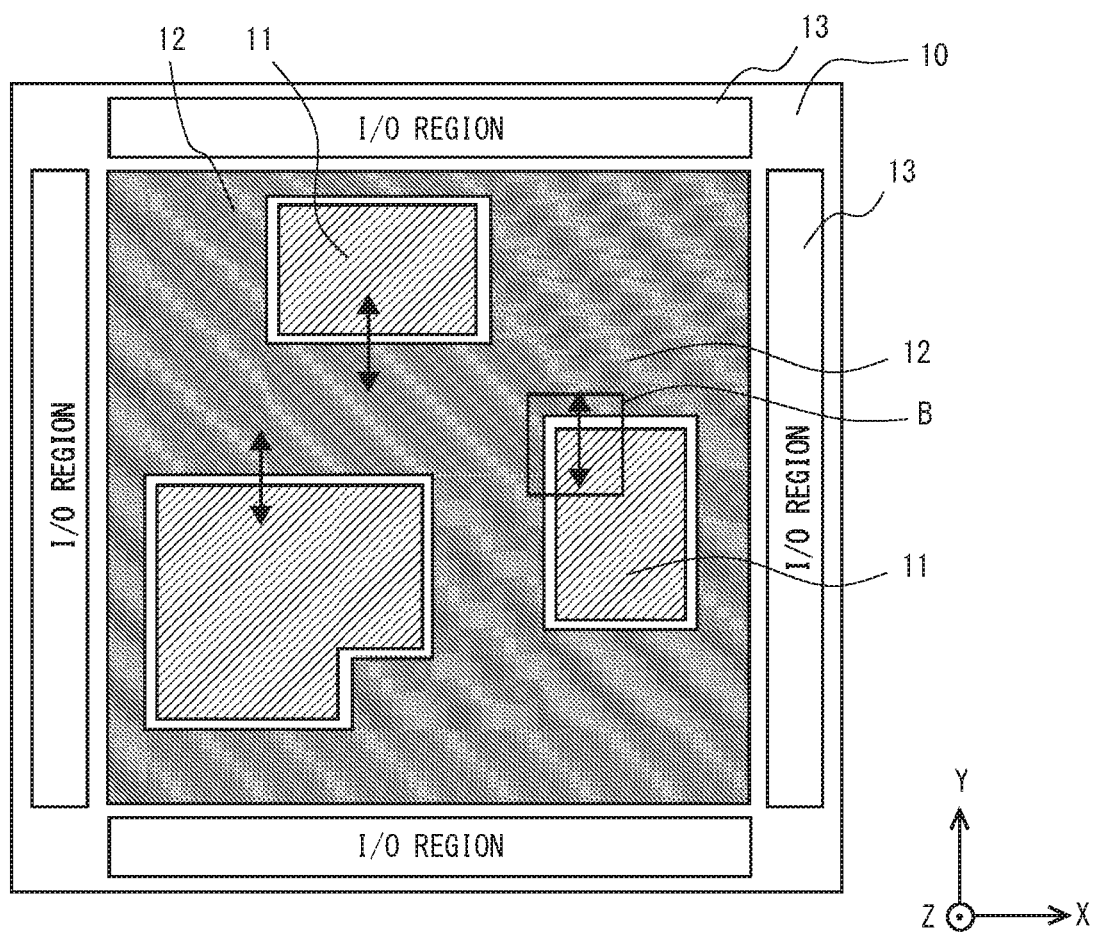
FIG. 15 is a plan view illustrating a semiconductor device according to a fourth embodiment.
Figure 16:
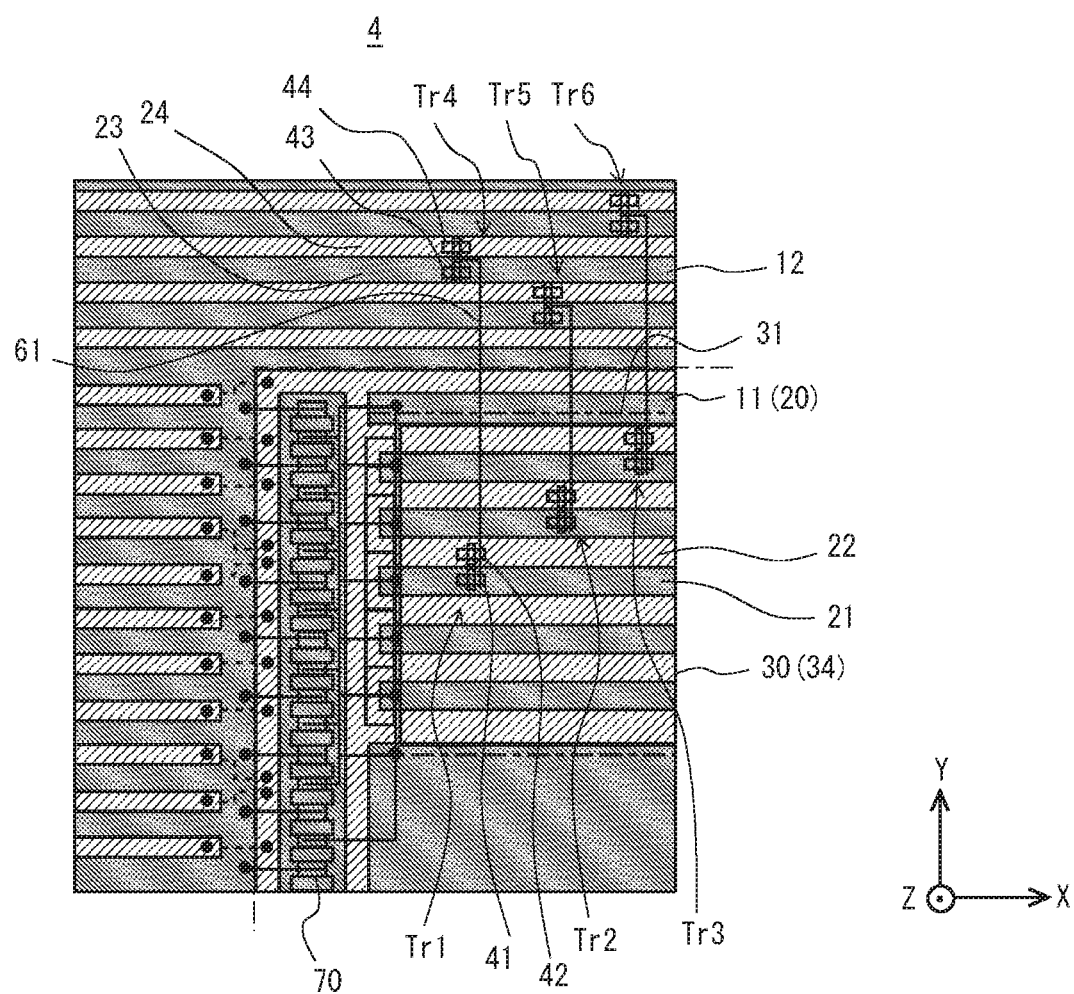
FIG. 16 is a plan view illustrating the semiconductor device according to the fourth embodiment, and shows an enlarged view of a B region of FIG. 15.
Figure 17:
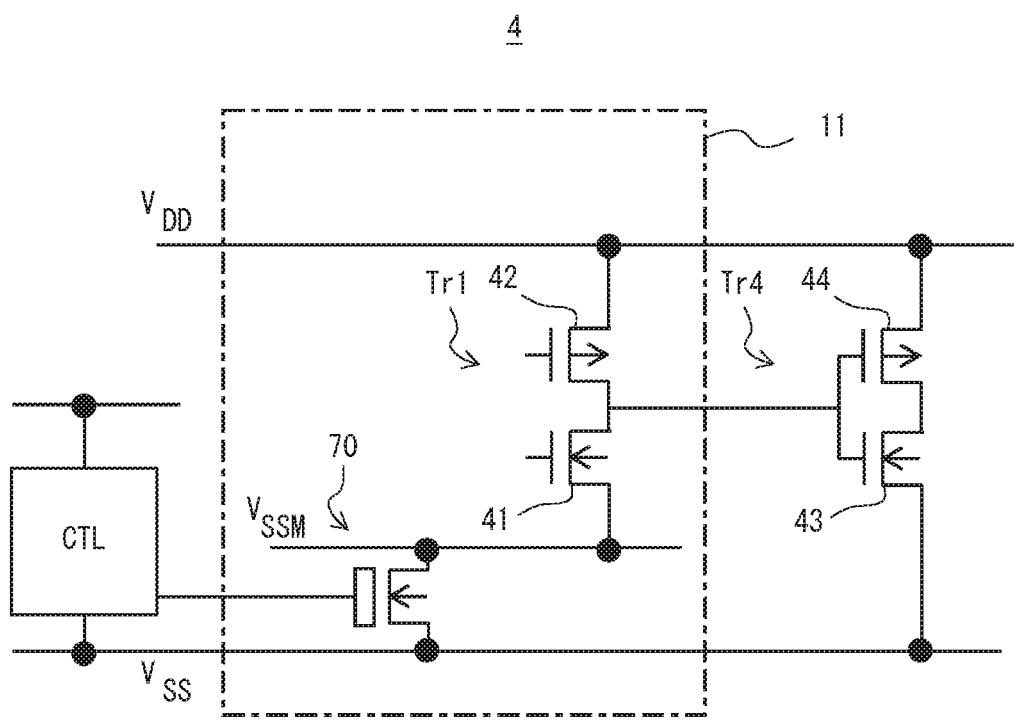
FIG. 17 is a circuit diagram illustrating a power supply interrupting switch of the semiconductor device according to the fourth embodiment.
Figure 18:
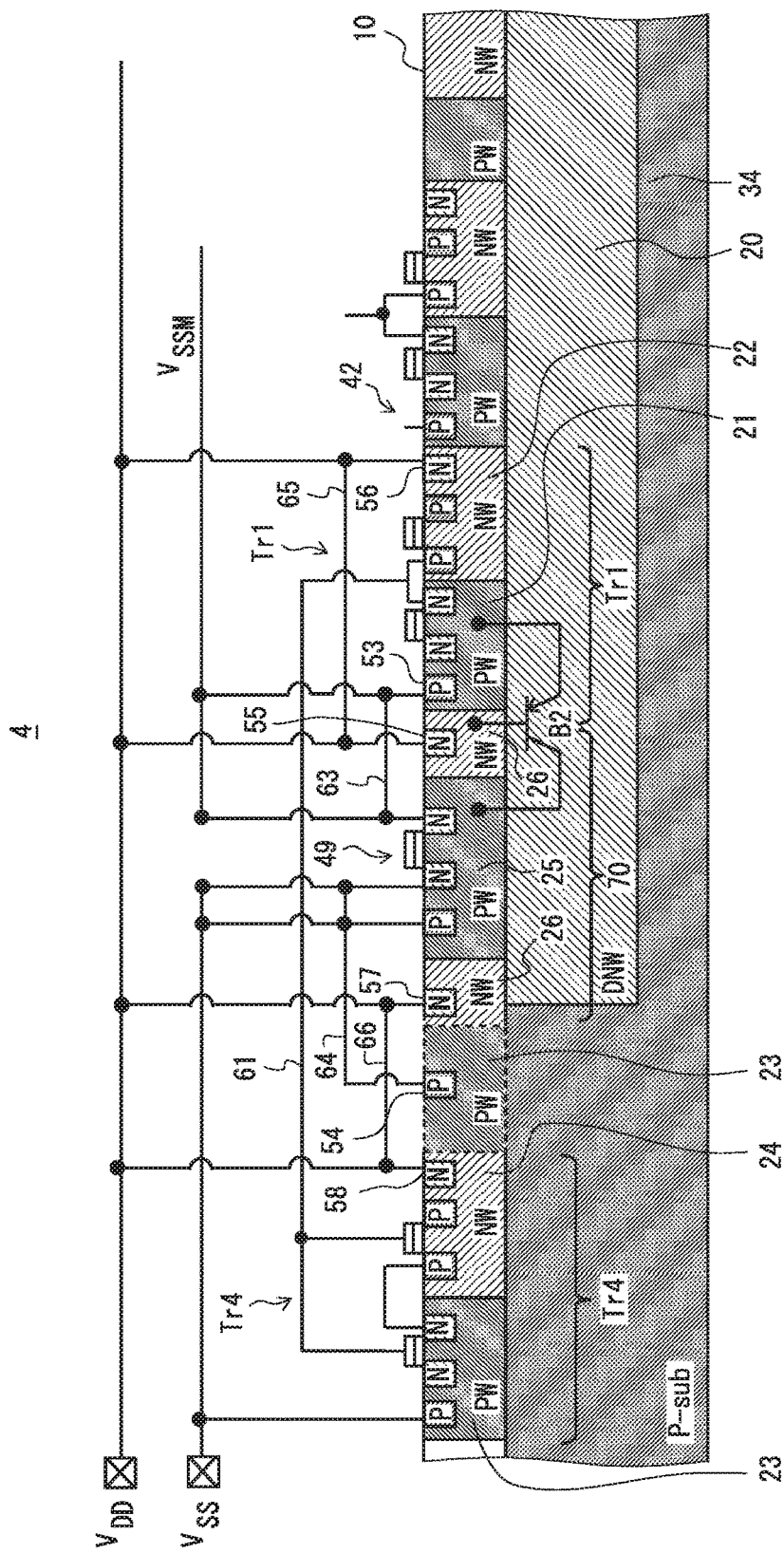
FIG. 18 is a cross-sectional view illustrating the semiconductor device according to the fourth embodiment.

Next, a semiconductor device according to a fourth embodiment will be explained. This embodiment is an example of the semiconductor device including a power supply interrupting switch. FIG. 15 is a plan view illustrating the semiconductor device according to the fourth embodiment. FIG. 16 is a plan view illustrating the semiconductor device according to the fourth embodiment, and shows an enlarged view of the B area of FIG. 15. FIG. 17 is a circuit diagram illustrating the power supply interrupting switch of the semiconductor device according to the fourth embodiment. FIG. 18 is a cross-sectional view illustrating the semiconductor device according to the fourth embodiment. The cross-sectional view shown in FIG. 18 is a schematic one.

As shown in FIG. 15, the second region 12 is provided in the central part of the principal surface 10 of the semiconductor device 4. Then the first region 11 is formed in an island shape inside the second region 12 and is surrounded by the second region 12. The first region 11 and the second region 12 are connected to each other by a wire such as a signal wire. The first region 11 and the second region 12 may be connected to each other at a plurality of locations. The semiconductor device 4 includes a power supply interrupting region and a non-power supply interrupting region. The first region 11 is, for example, a power supply interrupting region.

As shown in FIG. 16, the semiconductor device 4 includes a power supply interrupting switch 70. The power supply interrupting switch 70 is formed, for example, in the vicinity of the boundary between the first region 11 and the second region 12. In the first region 11, the shallow P-well 21 and the shallow N-well 22 are formed on the deep N-well 20.

The field effect transistor 41 is formed on the shallow P-well 21. The field effect transistor 42 is formed on the shallow N-well 22. The transistor pair Tr1 includes the field effect transistors 41 and 42.

In the second region 12, the shallow P-well 23 and the shallow N-well 24 are formed on the base material 34. The field effect transistor 43 is formed on the shallow P-well 23. The field effect transistor 44 is formed on the shallow N-well 24. The transistor pair Tr4 includes the field effect transistors 43 and 44. The wire between transistor pairs 61 connects the drain electrode D of the transistor pair Tr1 and the gate electrode G of the transistor pair Tr4.

As shown in FIG. 17, the first region 11 is a power supply interrupting region. The transistor pair Tr1 is formed in the first region 11. The source of the field effect transistor 42 that composes the transistor pair Tr1 is connected to $V_{DD}$, and the source of the field effect transistor 41 is connected to $V_{SSM}$. On the other hand, the source of the field effect transistor 44 in the transistor pair Tr4 is connected to $V_{DD}$, and the source of the field effect transistor 43 is connected to $V_{SS}$. Then the power supply interrupting switch 70 is provided between $V_{SSM}$ and $V_{SS}$. For example, the power supply interrupting switch 70 is provided in the ground-side power supply wire. The ground-side voltage Vssm in the first region 11, which is a power supply interrupting region, is different from the ground-side voltage Vss in the non-power supply interrupting region. Therefore, the power supply interrupting switch 70 controls the electrical conduction between the power supply wire of the transistor pair Tr1 and the power supply wire of the transistor pair Tr4. The electrical conduction of the power supply interrupting switch 70 is controlled by, for example, a controller CTL. By interrupting the electrical conduction by the power supply interrupting switch 70, the power supply wire of the transistor pair Tr1 can be made different from the power supply voltage of the transistor pair Tr4.

In the semiconductor device 4 according to this embodiment, the power supply voltage of the transistor pair Tr1 is different from the power supply voltage of the transistor pair Tr4. Therefore, the shallow P-well 21 in the first region 11 and the shallow P-well 23 in the second region 12 cannot be connected to each other by, for example, the inter-tap wire 62. Therefore, like in the inter-tap wire 62, the electric charges accumulated in the deep N-well 20 and the shallow P-well 21 are moved toward the base material 34 using the power supply interrupting switch 70.

As shown in FIG. 18, a shallow P-well 25 (a fifth shallow well) is formed in a region of the deep N-well 20 on the side of the principal surface 10 other than the region in which the shallow P-well 21 and the shallow N-well 22 are formed. A field effect transistor 49 is formed on the shallow P-well 25. That is, one diffusion layer N and another diffusion layer N, which serve as the source and the drain of the field effect transistor 49, are formed in a part of the shallow P-well 25 on the side of the principal surface 10. The field effect transistor 49 is a transistor for power supply interruption.

A diffusion tap 53 (a third diffusion tap) including a P-type diffusion layer P is formed in a part of the shallow P-well 21 on the side of the principal surface 10. A diffusion tap 54 (a fourth diffusion tap) including a P-type diffusion layer P is formed in a part of the shallow P-well 23 on the side of the principal surface 10. Then the drain of the field effect transistor 49 and the diffusion tap 53 are connected to each other by a switch wire 63. The source of the field effect transistor 49 and the diffusion tap 54 are connected to each other by a switch wire 64.

The wiring layer in which the switch wire 63 is present and the wiring layer in which the switch wire 64 is present are arranged to be closer to the semiconductor substrate 30 than the wiring layer in which the wire between transistor pairs 61 is present is. That is, the switch wire 63 and the switch wire 64 are formed below the wire between transistor pairs 61. Therefore, in the process of manufacturing the semiconductor device 4, the switch wire 63 and the switch wire 64 are formed earlier than the wire between transistor pairs 61.

The field effect transistor 49 is formed in such a way that the channel current flows between one diffusion layer N and the other diffusion layer N in a state in which no voltage is applied to the gate electrode. In the process of manufacturing the semiconductor device 4, no voltage is applied to the gate electrode of the field effect transistor 49 at the timing when the switch wire 63 and the switch wire 64 are formed.

However, in the field effect transistor 49, even in a state in which no voltage is applied to the gate electrode, the channel current flows from one diffusion layer N to the other diffusion layer N. Therefore, even when the processing using plasma is performed before they are connected to each other by the wire between transistor pairs 61, electric charges accumulated in the deep N-well 20 and the shallow P-well 21 can be moved toward the base material 34 via a channel of the field effect transistor 49. After the semiconductor device 4 is formed, a voltage is applied to the gate electrode of the field effect transistor 49 using by the controller CTL. It is therefore possible to make the first region 11 be the power supply interrupting region.

As shown in FIG. 18, a shallow N-well 26 (a sixth shallow well) is formed in the vicinity of the power supply interrupting switch 70 in a region of the deep N-well 20 on the side of the principal surface 10 other than the region in which the shallow P-well 21 and the shallow N-well 22 are formed. A diffusion tap 55 (a fifth diffusion tap) including the N-type diffusion layer N is formed in a part of the shallow N-well 26 on the side of the principal surface 10. A diffusion tap 56 (a sixth diffusion tap) including the N-type diffusion layer N is formed in a part of the shallow N-well 22 on the side of the principal surface 10. Then an inter-tap wire 65 connects the diffusion tap 55 and the diffusion tap 56.

The wiring layer in which the inter-tap wire 65 is present is arranged to be closer to the semiconductor substrate 30 than the wiring layer in which the wire between transistor pairs 61 is present is. That is, the inter-tap wire 65 is formed below the wire between transistor pairs 61. Therefore, in the process of manufacturing the semiconductor device 4, the inter-tap wire 65 is formed earlier than the wire between transistor pairs 61.

As shown in FIG. 18, by forming the inter-tap wire 65, a parasitic PNP bipolar B2 is formed by the shallow P-well 21, the shallow N-well 26, and the shallow P-well 25. By using the parasitic bipolar B2, electric charges accumulated in the deep N-well 20 and the shallow P-well 21 can be discharged.

Further, a diffusion tap 57 including the N-type diffusion layer N is formed in a part of the shallow N-well 26 on the side of the principal surface 10. A diffusion tap 58 including the N-type diffusion layer N is formed in a part of the shallow N-well 24 on the side of the principal surface 10. Then an inter-tap wire 66 connects the diffusion tap 57 and the diffusion tap 58.

The wiring layer in which the inter-tap wire 66 is present is arranged to be closer to the semiconductor substrate 30 than the wiring layer in which the wire between transistor pairs 61 is present is. According to this structure, the electric charges accumulated in the deep N-well 20 and the shallow P-well 21 can be discharged using the channel current of the transistor pair Tr4. Therefore, in the semiconductor device 4, gate breakdown of the transistor pairs Tr4-Tr6 can be suppressed.

As described above, by using the power supply interrupting switch 70, a part of the region of the semiconductor device 4 can be interrupted from the other part and the power supply can be separated. Accordingly, occurrence of a through current and a leakage current in the semiconductor device 4 can be suppressed.

When, for example, a device such as the CPU or a graphic module is included in the semiconductor device 4, the deep N-well 20 is formed in the region where this device is formed. For example, in order to suppress noise from the base material 34, this device is formed on the deep N-well 20. Further, this device is formed on the deep N-well 20 in order to achieve the multiple power supply design. Then the proportion of the area of the deep N-well 20 in the principal surface 10 becomes large. When this element is not operated, this region is interrupted by the power supply interrupting switch 70, whereby power consumption can be reduced. The other effects are included in the descriptions of the first to third embodiments.

Fifth Embodiment

Figure 19:
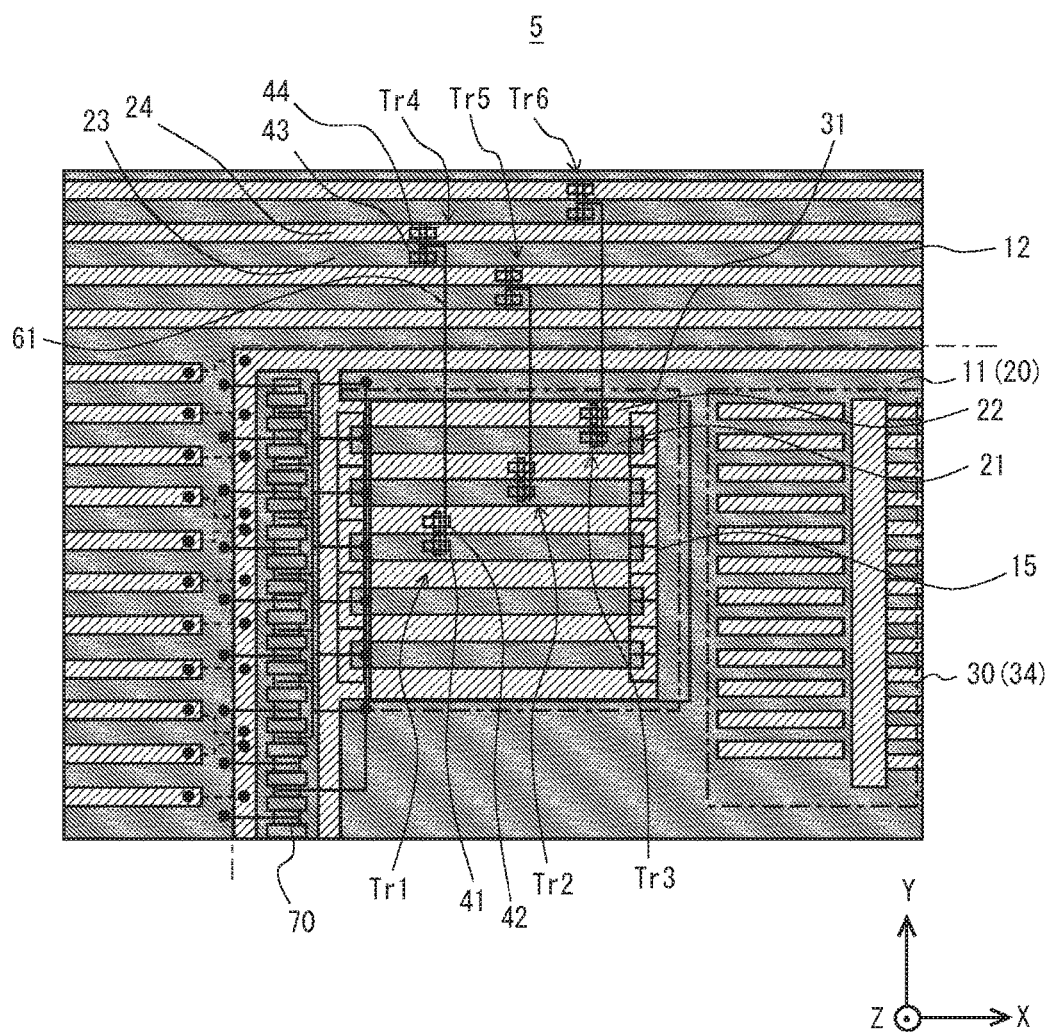
FIG. 19 is a plan view illustrating a semiconductor device according to a fifth embodiment.

Next, a semiconductor device according to a fifth embodiment will be explained. The semiconductor device according to this embodiment includes a power supply interrupting switch 70. Furthermore, the shallow N-well 22 surrounds the peripheral edge of the region of the shallow P-well 21. FIG. 19 is a plan view illustrating a semiconductor device 5 according to the fifth embodiment.

As shown in FIG. 19, in the semiconductor device 5, the peripheral edge of the region of the shallow P-well 21 is surrounded by the shallow N-well 22. For example, it has a shape that reflects the boundary cell 15. The shape thereof is not necessarily the one that reflects the boundary cell 15 and may reflect the bridge cell 16 or the surrounding cell 17.

In the semiconductor device 5, the area of the shallow P-well 21 can be made small. It is therefore possible to further suppress gate breakdown of the transistor pairs Tr4-Tr6. The other effects are included in the description in the first to fourth embodiments.

Sixth Embodiment

Figure 20:
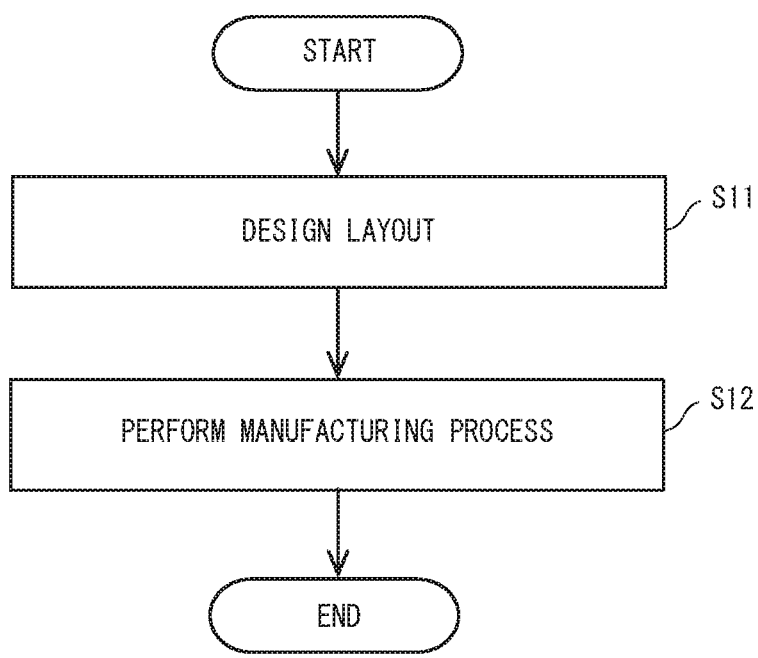
FIG. 20 is a flowchart illustrating a method of manufacturing a semiconductor device according to a sixth embodiment.

Next, a sixth embodiment will be explained. This embodiment describes a method of manufacturing a semiconductor device. FIG. 20 is a flowchart for illustrating the method of manufacturing the semiconductor device according to the sixth embodiment. As shown in FIG. 20, the method of manufacturing the semiconductor device will be explained by dividing this method into a first process for designing the layout (Step S11) and a second process for performing the manufacturing process (Step S12).

Figure 21:
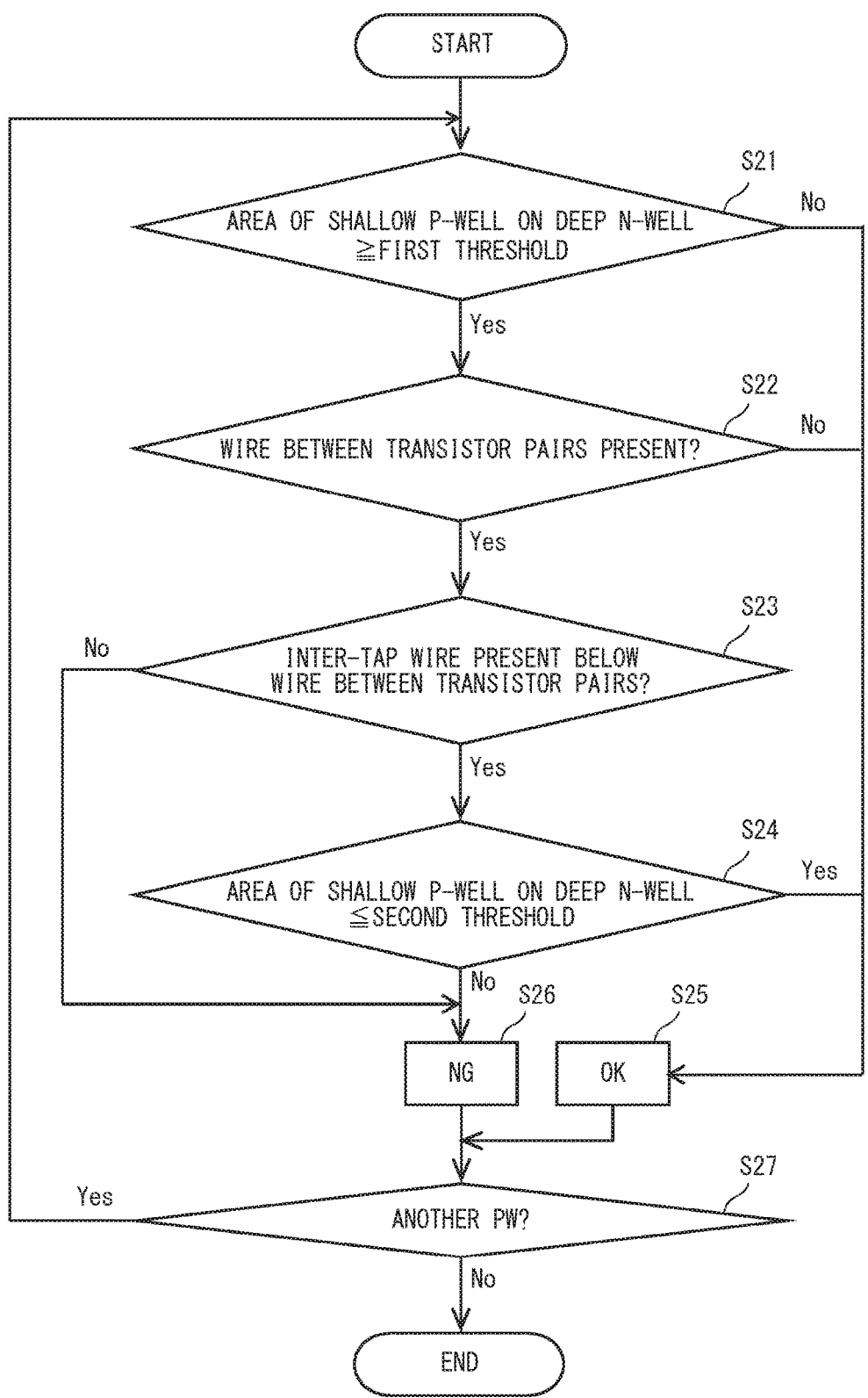
FIG. 21 is a flowchart illustrating a first process for designing the layout in the method of manufacturing the semiconductor device according to the sixth embodiment.
Figure 22:
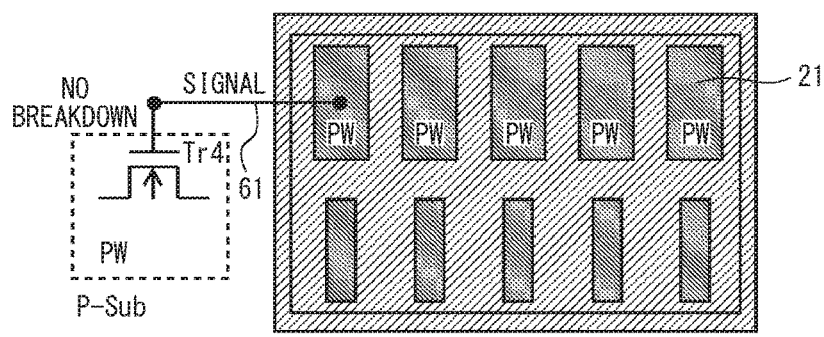
FIG. 22 is a diagram illustrating results of a determination in the first process for designing the layout according to the sixth embodiment.
Figure 23:
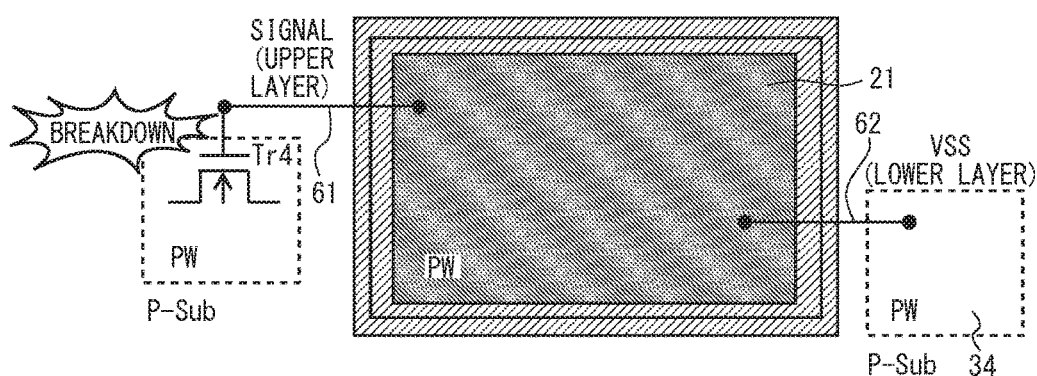
FIG. 23 is a diagram illustrating results of a determination in the first process for designing the layout according to the sixth embodiment.
Figure 24:
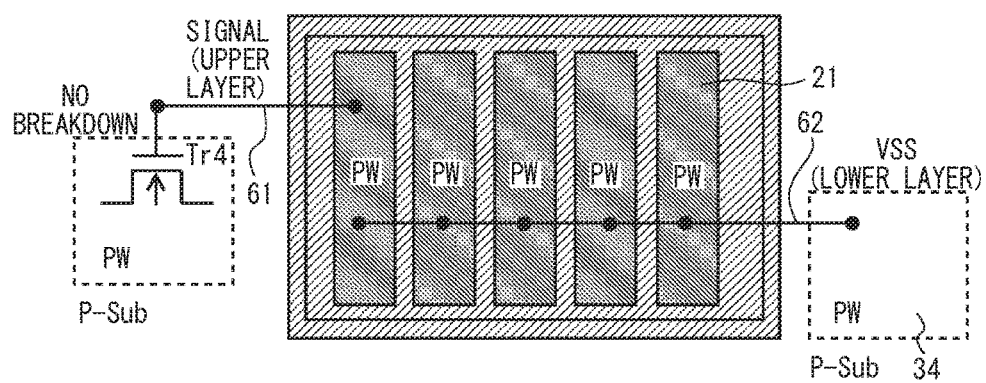
FIG. 24 is a diagram illustrating results of a determination in the first process for designing the layout according to the sixth embodiment.

As shown in Step S11 shown in FIG. 20, first, the first process for designing the layout will be explained. FIG. 21 is a flowchart illustrating the first process for designing the layout in the method of manufacturing the semiconductor device according to the sixth embodiment. FIGS. 22-24 are diagrams illustrating results of a determination in the first process for designing the layout according to the sixth embodiment.

The first process for designing the layout includes the design of the layout of the shallow P-well 21, the shallow N-well 22, the shallow P-well 23, and the shallow N-well 24 formed in a part of the semiconductor substrate 30 on the side of the principal surface 10, and the deep N-well 20 formed in a region including the shallow P-well 21 and the shallow N-well 22, which is a region other than the region in which the shallow P-well 23 and the shallow N-well 24 are formed, in such a way that they are formed in regions different from each other when the semiconductor substrate 30 is seen from the principal surface 10.

Further, in the first process for designing the layout, the shallow N-well 22 is laid out in such a way as to surround the peripheral edge of the region of the shallow P-well 21. For example, the shallow P-well 21 is laid out in such a way that it is extended in the X-axis direction. Then the boundary cell 15 is arranged in the end side of the shallow P-well 21 in the X-axis direction. Alternatively, the bridge cell 16 is arranged in the central part of the shallow P-well 21 in the X-axis direction. Further, the first process for designing the layout includes the design flow of the layout of the shallow P-well 21 shown below.

As shown in Step S21 of FIG. 21, first, it is determined whether the area of the shallow P-well 21 on the deep N-well 20 is equal to or larger than the predetermined first threshold. When the area of the shallow P-well 21 is smaller than the predetermined first threshold (No), as shown in Step S25 of FIG. 21, it is determined that the shallow P-well 21 passes in terms of the design. As shown in FIG. 22, the area of the shallow P-well 21 is small, whereby gate breakdown of the transistor pair Tr4 can be suppressed.

On the other hand, when the area of the shallow P-well 21 is equal to or larger than the predetermined first threshold (Yes), as shown in Step S22 of FIG. 21, it is determined whether there is a wire between transistor pairs 61. The wire between transistor pairs 61 is a wire provided between the transistor pair Tr1 formed in the shallow P-well 21 and the transistor pair Tr4 formed in the shallow P-well 23.

When there is no wire between transistor pairs 61 (No), since the shallow P-well 21 has no relation with gate breakdown of the transistor pair Tr4, the shallow P-well 21 is determined to pass in terms of the design as shown in Step S25 of FIG. 21.

On the other hand, when there is a wire between transistor pairs 61 (Yes), as shown in Step S23 of FIG. 21, it is determined whether there is an inter-tap wire 62 below the wire between transistor pairs 61.

When there is no inter-tap wire 62 below the wire between transistor pairs 61 (No), as shown in Step S26 of FIG. 21, it is determined that this shallow P-well 21 fails in terms of the design.

On the other hand, when the inter-tap wire 62 is provided below the wire between transistor pairs 61 (Yes), as shown in Step S24 of FIG. 21, it is determined whether the area of the shallow P-well 21 is equal to or smaller than a predetermined second threshold. The second threshold is a value larger than the first threshold. When the area of the shallow P-well 21 is larger than the predetermined second threshold (No), as shown in Step S26 of FIG. 21, it is determined that this shallow P-well 21 fails in terms of the design. As shown in FIG. 23, in this case, gate breakdown of the transistor pair Tr4 cannot be suppressed.

On the other hand, when the area of the shallow P-well 21 is equal to or smaller than the predetermined second threshold (Yes), as shown in Step S25 of FIG. 21, the shallow P-well 21 is determined to pass in terms of the design. As shown in FIG. 24, the electric charges accumulated in the deep N-well 20 and the shallow P-well 21 can be moved to the base material 34 via the inter-tap wire 62.

After the determination is made in Steps S25 and S26 in FIG. 21, as shown in Step S27 of FIG. 21, it is determined whether there is another shallow P-well 21 that should be determined. When there is another shallow P-well 21 that should be determined (Yes), the process goes back to Step S21 of FIG. 21, and a determination is made regarding the next shallow P-well 21. When there is no shallow P-well 21 that should be determined (No), the process ends. In this way, the layout design is performed and the layout of the semiconductor device to be manufactured is determined.

Figure 25:
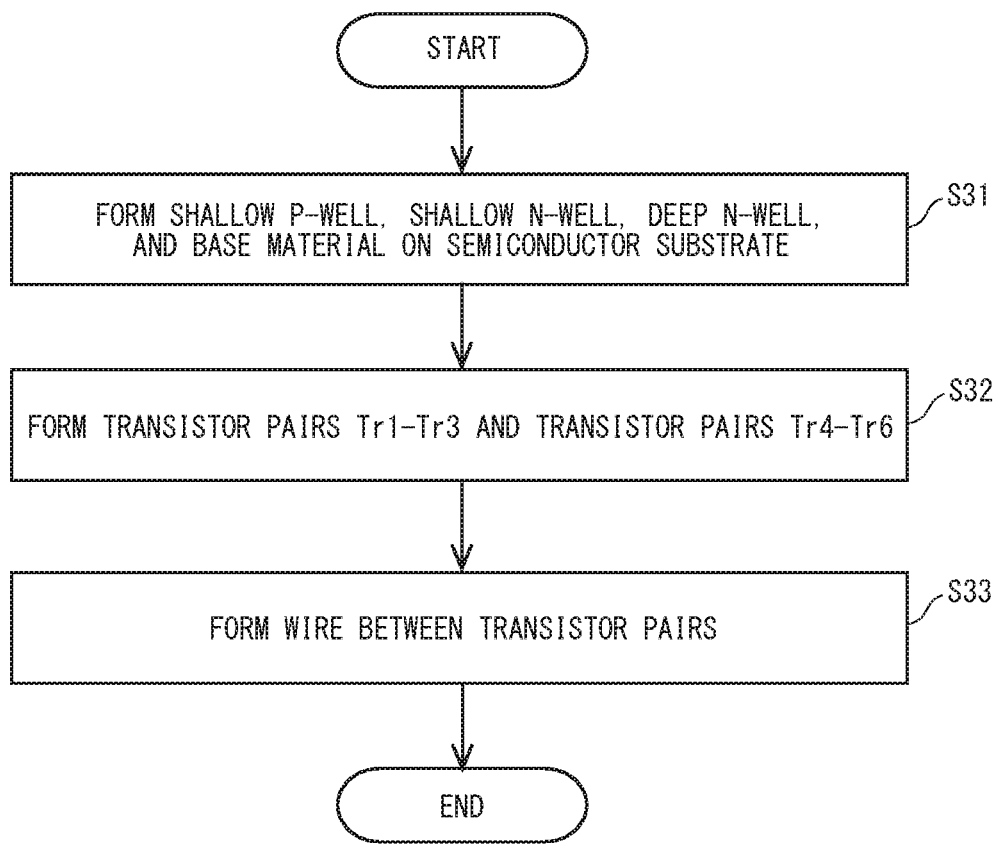
FIG. 25 is a flowchart illustrating a second process for performing a manufacturing process in the method of manufacturing the semiconductor device according to the sixth embodiment.

Next, as shown in Step S12 of FIG. 20, the manufacturing process is performed based on the layout determined in the first process for designing the layout. FIG. 25 is a flowchart illustrating the second process for performing the manufacturing process in the method of manufacturing the semiconductor device according to the sixth embodiment.

As shown in Step S31 of FIG. 25, the shallow P-wells 21 and 23, the shallow N-wells 22 and 24, the deep N-well 20, and the base material 34 are formed on the semiconductor substrate 30. Specifically, the shallow P-well 21, the shallow N-well 22, the shallow P-well 23, and the shallow N-well 24, the deep N-well 20 formed in a part deeper than the shallow P-well 21 and the shallow N-well 22 in the depth direction from the principal surface 10, and the base material 34 that is formed in a region including the shallow P-well 23, the shallow N-well 24, and the deep N-well 20 and is formed in a part deeper than the shallow P-well 23, the shallow N-well 24, and the deep N-well 20 in the depth direction from the principal surface 10 are formed on the semiconductor substrate 30. They are formed using a lithography technique, an ion implantation technique or the like.

When the shallow P-well 21 is formed, the shallow P-well 21 may be formed in such a way that the area thereof becomes smaller than the first threshold used in the determination in the first process for designing the layout.

In some cases, the shallow P-well 21 is formed in such a way that the area thereof falls within a range between the first threshold (inclusive) and the second threshold (inclusive) used in the determination in the first process for designing the layout.

Further, after the shallow P-well 21 and the shallow P-well 23 are formed, the diffusion tap 51 may be formed in a part of the shallow P-well 21 on the side of the principal surface 10 and the diffusion tap 52 may be formed in a part of the shallow P-well 23 on the side of the principal surface 10. In this case, the inter-tap wire 62 that connects the diffusion tap 51 and the diffusion tap 52 is formed earlier than the wire between transistor pairs 61.

Next, as shown in Step S32 of FIG. 25, the transistor pairs Tr1-Tr3 and the transistor pairs Tr4-Tr6 are formed. Specifically, the transistor pairs Tr1-Tr3 including the field effect transistor 41 in which the diffusion layer N is formed in a part of the shallow P-well 21 on the side of the principal surface 10 and the field effect transistor 42 in which the diffusion layer P is formed in a part of the shallow N-well 22 on the side of the principal surface 10, and the transistor pairs Tr4-Tr6 including the field effect transistor 43 in which the diffusion layer N is formed in a part of the shallow P-well 23 on the side of the principal surface 10 and the field effect transistor 44 in which the diffusion layer P is formed in a part of the shallow N-well 24 on the side of the principal surface 10 are formed.

Next, as shown in Step S33 of FIG. 23, the wire between transistor pairs 61 is formed. Specifically, the wire between transistor pairs 61 that connects the drain electrodes D of the transistor pairs Tr1-Tr3 and the gate electrodes G of the transistor pairs Tr4-Tr6 is formed. Then a predetermined process is added, whereby the semiconductor device is manufactured.

According to this embodiment, the area of the shallow P-well 21 formed on the deep N-well 20 can be made small. Therefore, gate breakdown of the transistor pairs Tr4-Tr6 formed on the base material 34 can be suppressed. It is possible to add, for example, the diffusion taps 51 and 52, in accordance with the area of the shallow P-well 21. Accordingly, the threshold of the area of the shallow P-well 21 can be made larger, whereby it is possible to improve the degree of freedom of the design.

Further, by using the boundary cell 15, the bridge cell 16 and the like, the layout design can be made simple. Further, it is possible to avoid gate breakdown in advance in the process of designing the layout. It is therefore possible to improve the manufacturing yield and the product reliability.

The matters shown below are also within the technical range that can be derived from the aforementioned embodiments.

(Supplementary Note 1)

A semiconductor device comprising a semiconductor substrate including a principal surface, wherein the semiconductor substrate comprises:

a first shallow well of a first conductive type, a second shallow well of a second conductive type, a third shallow well of the first conductive type, and a fourth shallow well of the second conductive type formed in a part of the semiconductor substrate on a side of a principal surface in such a way that they are in regions different from one another when the semiconductor substrate is seen from the principal surface;

a deep well of the second conductive type formed in a region including the first shallow well and the second shallow well, which is a region other than the region in which the third shallow well and the fourth shallow well are formed, the deep well of the second conductive type being formed in a part deeper than the first shallow well and the second shallow well in a depth direction from the principal surface;

a circling well of the second conductive type formed in a side edge of the deep well on the side of the principal surface along a peripheral edge of the deep well in such a way as to surround the first shallow well and the second shallow well; and a base material of the first conductive type formed in a region including the third shallow well, the fourth shallow well, and the deep well, the base material of the first conductive type being formed in a part deeper than the third shallow well, the fourth shallow well, and the deep well in the depth direction from the principal surface, the semiconductor device further comprises:

a first field effect transistor of the second conductive type in which a diffusion layer of the second conductive type is formed in a part of the first shallow well on the side of the principal surface;

a second field effect transistor of the second conductive type in which the diffusion layer of the second conductive type is formed in a part of the third shallow well on the side of the principal surface, or a third field effect transistor of the first conductive type in which the diffusion layer of the first conductive type is formed in a part of the fourth shallow well on the side of the principal surface; and an inter-transistor wire configured to connect the first field effect transistor and the second field effect transistor or the third field effect transistor, and the second shallow well is formed in such a way as to surround the peripheral edge of the region of the first shallow well.

While the disclosure made by the present inventors has been described in detail based on the embodiments, it is needless to say that the present disclosure is not limited to the embodiments already stated above and various changes may be made without departing from the spirit of the present disclosure.

The first, second, third, fourth, fifth and sixth embodiments can be combined as desirable by one of ordinary skill in the art.

While the invention has been described in terms of several embodiments, those skilled in the art will recognize that the invention can be practiced with various modifications within the spirit and scope of the appended claims and the invention is not limited to the examples described above.

Further, the scope of the claims is not limited by the embodiments described above.

Furthermore, it is noted that, Applicant's intent is to encompass equivalents of all claim elements, even if amended later during prosecution.

What is claimed is:

1. A semiconductor device comprising a semiconductor substrate including a principal surface, wherein
    the semiconductor substrate comprises:
        a first shallow well of a first conductive type, a second shallow well of a second conductive type, a third shallow well of the first conductive type, and a fourth shallow well of the second conductive type formed in a part of the semiconductor substrate on a side of a principal surface in such a way that they are in regions different from one another when the semiconductor substrate is seen from the principal surface;
        a deep well of the second conductive type formed in a region including the first shallow well and the second shallow well, which is a region other than the region in which the third shallow well and the fourth shallow well are formed, the deep well of the second conductive type being formed in a part deeper than the first shallow well and the second shallow well in a depth direction from the principal surface; and
        a base material of the first conductive type formed in a region including the third shallow well, the fourth shallow well, and the deep well, the base material of the first conductive type being formed in a part deeper than the third shallow well, the fourth shallow well, and the deep well in the depth direction from the principal surface, the semiconductor device further comprises:
        a first transistor pair comprising a field effect transistor of the second conductive type in which a diffusion layer of the second conductive type is formed in a part of the first shallow well on the side of the principal surface and the field effect transistor of the first conductive type in which the diffusion layer of the first conductive type is formed in a part of the second shallow well on the side of the principal surface;
        a second transistor pair comprising the field effect transistor of the second conductive type in which the diffusion layer of the second conductive type is formed in a part of the third shallow well on the side of the principal surface and the field effect transistor of the first conductive type in which the diffusion layer of the first conductive type is formed in a part of the fourth shallow well on the side of the principal surface; and
        a wire between transistor pairs configured to connect the first transistor pair and the second transistor pair, and
        the second shallow well is formed in such a way as to surround a peripheral edge of the region of the first shallow well.

2. The semiconductor device according to claim 1, wherein
    a plurality of first shallow wells are formed,
    the plurality of first shallow wells are formed to extend in one direction in a plane parallel to the principal surface and to align in another direction that crosses the one direction in the plane parallel to the principal surface, and
    the second shallow well is integrated by a connection of a part extended in the one direction formed between the first shallow wells that are adjacent to each other and a part extended in the other direction on respective end sides of the first shallow well in the one direction.

3. The semiconductor device according to claim 1, wherein
    a plurality of first shallow wells are formed,
    the plurality of first shallow wells are formed to extend in one direction in a plane parallel to the principal surface and to align in the one direction, and
    the second shallow well is formed on both sides of another direction that crosses the one direction in the plane parallel to the principal surface of the first shallow well in such a way as to sandwich the first shallow well, the second shallow well being integrated by a connection of a part extended in the one direction and a part formed between the first shallow wells aligned in the one direction.

4. The semiconductor device according to claim 1, further comprising:
    a first diffusion tap comprising the diffusion layer of the first conductive type formed in a part of the first shallow well on the side of the principal surface;
    a second diffusion tap comprising the diffusion layer of the first conductive type formed in a part of the third shallow well on the side of the principal surface; and
    a first inter-tap wire configured to connect the first diffusion tap and the second diffusion tap,
    wherein a wiring layer in which the first inter-tap wire is present is arranged to be closer to the semiconductor substrate than the wiring layer in which the wire between transistor pairs is present is.

5. The semiconductor device according to claim 4, wherein
    the first shallow well comprises an elongated shape, and
    the part of the first shallow well where the first diffusion tap is formed is at an end part of the first shallow well.

6. The semiconductor device according to claim 1, further comprising
    a power supply interrupting switch configured to control electrical conduction between a power supply wire of the first transistor pair and the power supply wire of the second transistor pair,
    wherein the power supply interrupting switch interrupts the electrical conduction, to thereby make a power supply voltage of the first transistor pair different from the power supply voltage of the second transistor pair.

7. The semiconductor device according to claim 6, further comprising:
    a third diffusion tap comprising the diffusion layer of the first conductive type formed in a part of the first shallow well on the side of the principal surface; and a fourth diffusion tap comprising the diffusion layer of the first conductive type formed in a part of the third shallow well on the side of the principal surface, wherein the power supply interrupting switch comprises:
a fifth shallow well of the first conductive type formed in a region of the deep well on the side of the principal surface other than the region where the first shallow well and the second shallow well are formed;
a power supply interrupting transistor of the second conductive type in which one diffusion layer and another diffusion layer of the second conductive type are formed on a part of the fifth shallow well on the side of the principal surface; and
a wiring layer in which a first switch wire that connects the third diffusion tap and the one diffusion layer is present and the wiring layer in which a second switch wire that connects the fourth diffusion tap and the other diffusion layer is present are arranged to be closer to the semiconductor substrate than the wiring layer in which the wire between transistor pairs is present is.

8. The semiconductor device according to claim 7, wherein the power supply interrupting switch is formed in such a way that a channel current flows between the one diffusion layer and the other diffusion layer in a state in which no voltage is applied to a gate electrode of the power supply interrupting transistor.

9. The semiconductor device according to claim 6, further comprising:
a sixth shallow well of the second conductive type formed in a region of the deep well on the side of the principal surface other than the region where the first shallow well and the second shallow well are formed;
a fifth diffusion tap comprising the diffusion layer of the second conductive type formed in a part of the sixth shallow well on the side of the principal surface;
a sixth diffusion tap comprising the diffusion layer of the second conductive type formed in a part of the second shallow well on the side of the principal surface; and
a second inter-tap wire configured to connect the fifth diffusion tap and the sixth diffusion tap,
wherein a wiring layer in which the second inter-tap wire is present is arranged to be closer to the semiconductor substrate than the wiring layer in which the wire between transistor pairs is present is.

10. The semiconductor device according to claim 6, further comprising:
a seventh shallow well of the second conductive type formed in a region of the deep well on the side of the principal surface other than the region where the first shallow well and the second shallow well are formed;
a seventh diffusion tap comprising the diffusion layer of the second conductive type formed in a part of the seventh shallow well on the side of the principal surface;
an eighth diffusion tap comprising the diffusion layer of the second conductive type formed in a part of the fourth shallow well on the side of the principal surface; and
a third inter-tap wire configured to connect the seventh diffusion tap and the eighth diffusion tap,
wherein a wiring layer in which the third inter-tap wire is present is arranged to be closer to the semiconductor substrate than the wiring layer in which the wire between transistor pairs is present is.

11. The semiconductor device according to claim 1, wherein the wire between transistor pairs connects an output of the first transistor pair and an input of the second transistor pair.

12. The semiconductor device according to claim 1, wherein the first conductive type is a P type and the second conductive type is an N type.

13. A method of manufacturing a semiconductor device comprising a semiconductor substrate including a principal surface, the method comprising:
a first process for designing a layout of a first shallow well of a first conductive type, a second shallow well of a second conductive type, a third shallow well of the first conductive type, and a fourth shallow well of the second conductive type formed on the semiconductor substrate on a side of the principal surface in such a way that they are in regions different from one another when the semiconductor substrate is seen from the principal surface, and a deep well of the second conductive type formed in a region including the first shallow well and the second shallow well, which is a region other than the region in which the third shallow well and the fourth shallow well are formed; and
a second process for performing a manufacturing process based on the layout determined in the first process for designing the layout, wherein
the second process for performing the manufacturing process comprises steps of:
forming the first shallow well, the second shallow well, the third shallow well, the fourth shallow well, the deep well formed in a part deeper than the first shallow well and the second shallow well in a depth direction from the principal surface, and a base material of the first conductive type formed in a region including the third shallow well, the fourth shallow well, and the deep well, the base material of the first conductive type being formed in a part deeper than the third shallow well, the fourth shallow well, and the deep well, on the semiconductor substrate;
forming a first transistor pair comprising a field effect transistor of the second conductive type in which a diffusion layer of the second conductive type is formed in a part of the first shallow well on the side of the principal surface and the field effect transistor of the first conductive type in which the diffusion layer of the first conductive type is formed in a part of the second shallow well on the side of the principal surface and a second transistor pair comprising the field effect transistor of the second conductive type in which the diffusion layer of the second conductive type is formed in a part of the third shallow well on the side of the principal surface and the field effect transistor of the first conductive type in which the diffusion layer of the first conductive type is formed in a part of the fourth shallow well on the side of the principal surface; and
forming a wire between transistor pairs that connects the first transistor pair and the second transistor pair, and
in the first process for designing the layout, the second shallow well is arranged in such a way as to surround a peripheral edge of the region of the first shallow well.

14. The method of manufacturing the semiconductor device according to claim 13, wherein
the first process for designing the layout comprises the step of determining whether an area of the first shallow well when it is seen from the principal surface is equal to or larger than a predetermined first threshold, and in the step of forming the wells and the base material on the semiconductor substrate, the first shallow well whose area is smaller than the first threshold is formed.

15. The method of manufacturing the semiconductor device according to claim 13, wherein the first process for designing the layout further comprises the steps of:
  determining whether an area of the first shallow well when it is seen from the principal surface is equal to or larger than a predetermined first threshold; and
  determining whether the area is equal to or smaller than a second threshold larger than the first threshold, the second process for performing the manufacturing process further comprises the steps of:
  forming a first diffusion tap including the diffusion layer of the first conductive type in a part of the first shallow well on the side of the principal surface and forming a second diffusion tap including the diffusion layer of the first conductive type in a part of the third shallow well on the side of the principal surface; and
  forming a first inter-tap wire that connects the first diffusion tap and the second diffusion tap prior to the step of forming the wire between transistor pairs, and in the step of forming the wells and the base material on the semiconductor substrate, the first shallow well having an area equal to or larger than the first threshold but equal to or smaller than the second threshold is formed.

16. The method of manufacturing the semiconductor device according to claim 13, wherein in the second process for performing the manufacturing process, processing using plasma is performed prior to the step of forming the wire between transistor pairs.

17. The method of manufacturing the semiconductor device according to claim 13, wherein in the first process for designing the layout, the first shallow well comprises an elongated shape and is arranged in such a way that it is extended in one direction in a plane parallel to the principal surface, and a boundary cell including a part of the first shallow well and a part of the second shallow well is arranged in an end part of the first shallow well.

18. The method of manufacturing the semiconductor device according to claim 13, wherein in the first process for designing the layout, the first shallow well is arranged in such a way that it is extended in one direction in a plane parallel to the principal surface, and a bridge cell including a part of the first shallow well and a part of the second shallow well is arranged in a central part of the first shallow well in the one direction and the first shallow well is divided.

19. A semiconductor device comprising a semiconductor substrate including a principal surface, wherein the semiconductor substrate comprises:
  a first shallow well of a first conductive type, a second shallow well of a second conductive type, a third shallow well of the first conductive type, and a fourth shallow well of the second conductive type formed in a part of the semiconductor substrate on a side of a principal surface in such a way that they are in regions different from one another when the semiconductor substrate is seen from the principal surface;
  a deep well of the second conductive type formed in a region including the first shallow well and the second shallow well, which is a region other than the region in which the third shallow well and the fourth shallow well are formed, the deep well of the second conductive type being formed in a part deeper than the first shallow well and the second shallow well in a depth direction from the principal surface; and
  a base material of the first conductive type formed in a region including the third shallow well, the fourth shallow well, and the deep well, the base material of the first conductive type being formed in a part deeper than the third shallow well, the fourth shallow well, and the deep well in the depth direction from the principal surface, a plurality of first shallow wells are formed, the plurality of first shallow wells are formed to extend in one direction in a plane parallel to the principal surface and to align in another direction that crosses the one direction in the plane parallel to the principal surface, the second shallow well includes a part extended in the one direction formed between the first shallow wells that are adjacent to each other, the semiconductor device further comprises:
  a first field effect transistor of the second conductive type in which a diffusion layer of the second conductive type is formed in a part of the first shallow well on the side of the principal surface;
  a second field effect transistor of the second conductive type in which the diffusion layer of the second conductive type is formed in a part of the third shallow well on the side of the principal surface, or a third field effect transistor of the first conductive type in which the diffusion layer of the first conductive type is formed in a part of the fourth shallow well on the side of the principal surface; and
  an inter-transistor wire configured to connect the first field effect transistor and the second field effect transistor or the third field effect transistor, and the second shallow well is formed in such a way as to surround a peripheral edge of the region of the first shallow well.

* * * * *